United States Patent
Nakano

(10) Patent No.: US 8,487,318 B2
(45) Date of Patent: Jul. 16, 2013

(54) SEMICONDUCTOR DEVICE AND MANUFACTURING METHOD THEREOF

(75) Inventor: Yuki Nakano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 38 days.

(21) Appl. No.: 12/840,041

(22) Filed: Jul. 20, 2010

(65) Prior Publication Data

US 2011/0018005 A1     Jan. 27, 2011

(30) Foreign Application Priority Data

Jul. 21, 2009   (JP) ................................ 2009-170239
Jul. 2, 2010   (JP) ................................ 2010-152084

(51) Int. Cl.
    *H01L 31/0312*     (2006.01)

(52) U.S. Cl.
    USPC .............................. 257/77; 257/330; 257/340

(58) Field of Classification Search
    USPC .............. 257/77, 73, 328–330, 335, 340, 629
    See application file for complete search history.

(56) References Cited

U.S. PATENT DOCUMENTS 6,482,704 B1 *   11/2002   Amano et al. ................ 438/285

FOREIGN PATENT DOCUMENTS

JP     2007-258465 A     10/2007

* cited by examiner

*Primary Examiner* — Jack Chen
(74) *Attorney, Agent, or Firm* — Rabin & Berdo, P.C.

(57) ABSTRACT

A semiconductor device of the present invention includes a semiconductor layer composed of SiC, a metal layer directly bonded to one face of the semiconductor layer, and a high carbon concentration layer formed on a surface layer portion at one side of the semiconductor layer and containing more highly concentrated carbon than a surface layer portion of the other side. Further, a manufacturing method of a semiconductor device of the present invention includes the steps of forming, on a surface layer portion at one face side of a semiconductor layer composed of SiC, a high carbon concentration layer containing more highly concentrated carbon than a surface layer portion at the other face side by heat treatment and directly bonding metal to the high carbon concentration layer.

15 Claims, 22 Drawing Sheets

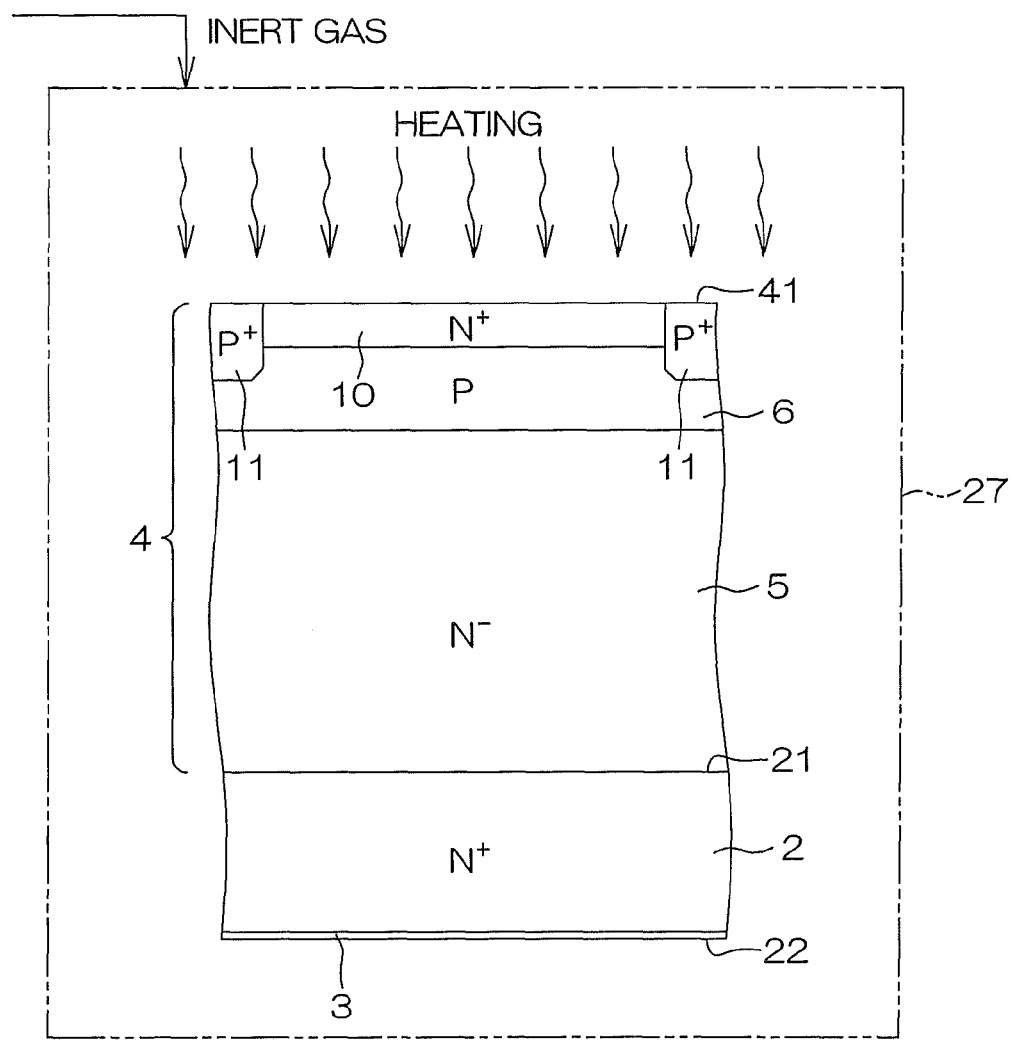

SEMICONDUCTOR DEVICE AND MANUFACTURING METHOD THEREOF

BACKGROUND OF THE INVENTION

1. Field of the Invention

The present invention relates to a semiconductor device using SiC and a manufacturing method thereof.

2. Description of Related Art

Use of SiC (silicon carbide) as a material for next-generation power devices which realize high breakdown voltage and low on-resistance has been considered in recent years.

A trench gate structure has been known as a structure for miniaturizing power devices and reducing on-resistance, (for example, Japanese Published Unexamined Patent Application No. 2007-258465).

In a semiconductor device disclosed in Japanese Published Unexamined Patent Application No. 2007-258465, first, a nickel (Ni) film is formed in a source region composed of SiC so as to form a source electrode electrically connected to the source region, and then the Ni film is annealed at 1000° C. for 5 minutes, whereby a nickel silicide layer is formed. After that, a metal layer composed of aluminum (Al) is laminated and a wiring electrode is formed, for example. In this manner, a source electrode is formed.

SUMMARY OF THE INVENTION

However, in such a manner that a nickel silicide layer is formed on SiC and a metal layer such as Al is laminated on the nickel silicide layer as in the conventional technique, carbon (C) remaining in SiC at the time of forming silicide is deposited in the vicinity of an interface between the nickel silicide layer and the metal layer. As a result, a carbon layer containing a large amount of C is formed in the vicinity of the interface. Since adhesion of the carbon layer with respect to the nickel silicide layer is poor, layer delamination may sometimes occur between the nickel silicide layer and the carbon layer. This kind of layer delamination is likely to be caused when a rear face electrode of a VDMISFET (Vertical Double-diffused Metal Insulator Semiconductor Field Effect Transistor) or an SBD (Schottky Barrier Diode) is formed.

On the other hand, it is conceivable that the layer delamination can be prevented by removing the carbon layer prior to the deposition of Al. However, a step of removing the carbon layer becomes additionally necessary, so that the number of steps is increased and manufacturing costs rise.

Accordingly, an object of the present invention is to provide a semiconductor device capable of suppressing an increase in manufacturing costs, improving connection reliability of a metal layer directly bonded on one face of a SiC substrate and further ensuring an ohmic contact of the metal layer with respect to the SiC substrate and a manufacturing method of the same.

This and other objects, features and effects of the present invention will become clear from the following description of embodiments with reference to the accompanying drawings.

DETAILED DESCRIPTION OF PREFERRED EMBODIMENTS

Figure 1:
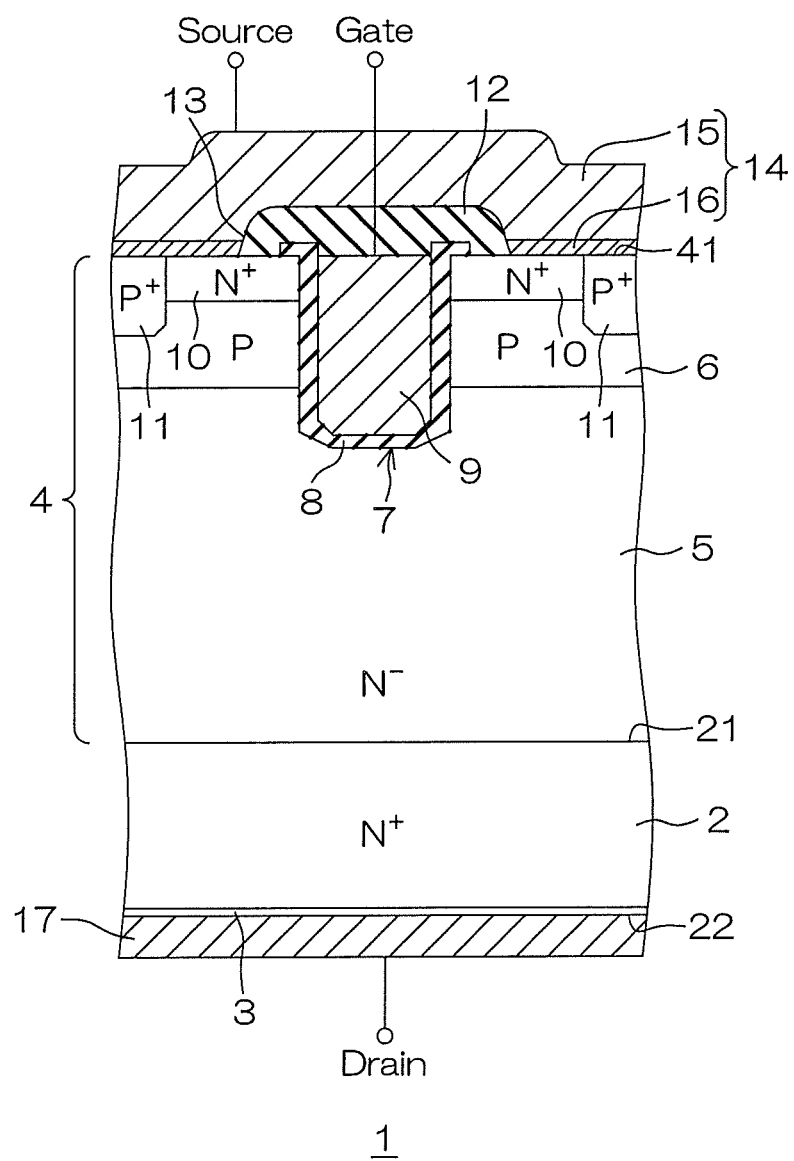
FIG. 1 is a schematic cross-sectional view of a semiconductor device (a trench gate VDMOSFET) according to a first embodiment of the present invention.

A semiconductor device according to one aspect of the present invention includes a semiconductor layer composed of SiC, a metal layer directly bonded to one face of the semiconductor layer, and a high carbon concentration layer formed on a surface layer portion at one side of the semiconductor layer and containing more highly concentrated carbon than a surface layer portion at the other side.

According to this configuration, the metal layer is directly bonded to the one face of the SiC semiconductor layer, so that a silicide layer or a carbon layer does not intervene between the semiconductor layer and the metal layer. Therefore, layer delamination between the semiconductor layer and the metal layer can be prevented. As a result, connection reliability of the metal layer with respect to the semiconductor layer can be improved.

Further, the surface layer portion at one side of the semiconductor substrate is formed with the high carbon concentration layer containing more highly concentrated carbon than the surface layer portion at the other side. Thus, the metal layer can be ohmically contacted to the semiconductor layer as in the case of bonding SiC and metal via a silicide layer.

Such a semiconductor device can be manufactured by, for example, a manufacturing method of a semiconductor device of the present invention. More specifically, the semiconductor device can be manufactured by a manufacturing method of a semiconductor device including the steps of forming, on a surface layer portion at one face side of a SiC semiconductor layer, a high carbon concentration layer containing more highly concentrated carbon than a surface layer portion at the other face side by heat treatment and of directly bonding metal to the high carbon concentration layer.

According to this method, the high carbon concentration layer is formed on the surface layer portion at one side of the semiconductor layer, and metal is directly bonded to the high carbon concentration layer to form a metal layer. Since a silicide layer is not formed on one face of the semiconductor layer, a step for removing the carbon layer on the silicide layer does not need to be carried out. Accordingly, an increase in the number of steps can be prevented, thereby allowing for suppressing an increase in manufacturing costs.

Further, a semiconductor device according to another aspect of the present invention includes a semiconductor layer composed of SiC, a metal layer directly bonded to one face of the semiconductor layer, and a high energy layer formed on a surface layer portion at one side of the semiconductor layer and having a higher binding energy than that specific to SiC.

According to this configuration, the metal layer is directly bonded to the one face of the SiC semiconductor layer, so that a silicide layer or a carbon layer does not intervene between the semiconductor layer and the metal layer. Thus, layer delamination between the semiconductor layer and the metal layer can be prevented. As a result, connection reliability of the metal layer with respect to the semiconductor layer can be improved.

Further, the high energy layer having a higher binding energy than that specific to SiC is formed on the surface layer portion at one side of the semiconductor substrate. Therefore, the metal layer can be ohmically contacted to the semiconductor layer as in the case of bonding SiC and metal via the silicide layer.

Further, in the semiconductor device of the present invention, the semiconductor layer may include a semiconductor substrate having a first impurity concentration and an epitaxial layer formed on a front face thereof and having a second impurity concentration. In that case, the first impurity concentration may be higher than the second impurity concentration and the high carbon concentration layer may be formed on a surface layer portion at a rear face side of the semiconductor substrate.

In this configuration, the high carbon concentration layer is formed on the semiconductor substrate having a relatively high impurity concentration, and thus, the metal layer can be ohmically contacted to the semiconductor substrate at a low resistance value.

The first impurity concentration of the semiconductor substrate is preferably not less than $1 \times 10^{17}$ cm$^{-3}$, and more preferably, $1 \times 10^{18}$ to $1 \times 10^{21}$ cm$^{-3}$.

When the first impurity concentration of the semiconductor substrate exceeds $1 \times 10^{17}$ cm$^{-3}$, the metal layer can be ohmically contacted to the semiconductor substrate much better.

Further, the metal layer bonded to the semiconductor layer may have a Ti/Ni/Ag laminated structure in which Ti, Ni and Ag are laminated in this order from the semiconductor layer side, and also may have a Ti/Ni/Ag/Au laminated structure in which Au is further laminated on the above laminated structure.

Further, the metal layer may be a drain electrode connected to a drain when the semiconductor layer has a vertical transistor structure including a drain formed at the one side of the semiconductor layer and a gate and a source formed at the other side on the opposite side of the drain.

In the vertical transistor structure, the concept of the drain includes a drain region (drift region) formed by injecting a first conductivity type impurity to the semiconductor layer. The concept of the gate includes a body region formed by injecting a second conductivity type impurity to the semiconductor layer and formed with a channel during operation of the semiconductor device, a gate insulating film formed on the body region and a gate electrode opposed to the body region with the gate insulating film interposed therebetween. The source includes a source region formed by injecting the first conductivity type impurity to the semiconductor layer.

In the manufacturing method of the semiconductor device of the present invention, a heat treatment temperature in the step of forming the high carbon concentration layer is preferably 1400° C. or higher.

The heat treatment exceeding 1400° C. allows Si atoms in SiC to be sublimated efficiently from one side of the semiconductor layer. Consequently, the high carbon concentration layer can be formed efficiently. Further, when impurity ions are injected into the semiconductor layer, for example, the impurity ions can be activated during the heat treatment step exceeding 1400° C. in parallel with the formation of the high carbon concentration layer. The heat treatment step and the activation step can be integrated into one step, thereby allowing the number of steps to be reduced, which resultingly allows manufacturing costs to be reduced.

Further, the step of forming the high carbon concentration layer preferably includes a step of treating the semiconductor layer with heat in an inert gas, a step of oxidizing the semiconductor substrate after the heat treatment step to form an oxide film on one face of the semiconductor layer and a step of removing the oxide film.

There are occasions when Si is hardly left in the surface layer portion at one side and a carbon layer composed of carbon is formed on this portion if a heat treatment temperature is too high.

In the afore-described manufacturing method, the semiconductor layer is oxidized after being treated with heat in the inert gas, whereby the oxide film is formed on the one face of the semiconductor layer, and then the oxide film is removed. As a result, even if a carbon layer is formed on the surface portion at the one face side, the carbon layer can be removed together with the oxide film.

Further, the high carbon concentration layer can also be formed by carrying out steps including a step of treating the semiconductor layer with heat in an oxidizing gas at 1400° C. or lower to form an oxide film on the one face of the semiconductor layer and a step of removing the above oxide film.

Hereinafter, embodiments of the present invention will be described in detail with reference to the accompanying drawings.

FIG. 1 is a schematic cross-sectional view of a semiconductor device (a trench gate VDMOSFET) according to a first embodiment of the present invention.

A semiconductor device 1 has a structure in which a plurality of unit cells of a trench gate VDMOSFET (Vertical Double-diffused Metal Insulator Semiconductor Field Effect Transistor) are arranged. It is noted that a part of the plurality of unit cells is shown in FIG. 1.

The semiconductor device 1 is provided with a SiC substrate 2 as a semiconductor substrate which forms a base thereof. The SiC substrate 2 is doped with a highly concentrated n-type impurity. A concentration of the n-type impurity is, for example, $1 \times 10^{17}$ cm$^{-3}$ or more, and preferably $1 \times 10^{18}$ to $1 \times 10^{21}$ cm$^{-3}$. The SiC substrate 2 has a front face 21 (the other face) being a Si (silicon) face and a rear face 22 (one face) being a C (carbon) face. A thickness of the SiC substrate 2 is 100 μm to 400 μm, for example.

A surface layer portion at the rear face 22 side of the SiC substrate 2 is formed with a layer (a high carbon concentration SiC layer 3) composed of SiC containing more highly concentrated carbon than a surface layer portion at the front face 21 side.

A composition ratio of C to Si (C/Si) in the high carbon concentration SiC layer 3 is such that a composition ratio of C (C1s) in is orbital to Si (Si2s) in 2s orbital (C1s/Si2s) is, for example, 1.1 to 1.2, and preferably 1.15 to 1.2. Further, a composition ratio of C1s to Si (Si2p) in 2p orbital (C1s/Si2p) is, for example, 1.2 to 1.4, and preferably 1.2 to 1.25.

The high carbon concentration SiC layer 3 having the composition ratios in the above ranges is a high energy layer having a higher binding energy than that specific to SiC, for example. Peaks in Si-2s orbital, Si-2p orbital and C-1s orbital analyzed by XPS (X-ray Photoelectron Spectroscopy) shift to a high binding energy side by, for example, 0.2 eV to 1 eV, and preferably 0.4 eV to 0.6 eV with respect to a relevant peak (a peak specific to SiC) of a portion excluding the high carbon concentration SiC layer 3 in the SiC substrate 2 (for example, the surface layer portion on the front face 21 side).

Further, a thickness of the high carbon concentration SiC layer 3 is, for example, on the order of $2.5 \times 10^{-4}$ to $1 \times 10^{-2}$% to that of the SiC substrate 2, and more specifically, 1 nm to 10 nm, for example.

An n⁻-type epitaxial layer 4 composed of SiC having been doped with a lower concentrated n-type impurity than the SiC substrate 2 is laminated on the front face 21 of the SiC substrate 2. The epitaxial layer 4 formed on the front face 21 being a Si face grows with the Si face being as a growth principal surface. Thus, a front face 41 of the epitaxial layer 4 is a Si face.

A portion at the C face side (a base layer portion) opposite to a portion at the Si face side (a surface layer portion) in the epitaxial layer 4 forms an n⁻-type drain region 5 where the whole portion is kept in a state of the post-epitaxial growth. An n-type impurity concentration of the drain region 5 is $1 \times 10^{15}$ to $1 \times 10^{17}$ cm⁻³, for example.

On the other hand, a p-type body region 6 is formed on the surface layer portion of the epitaxial layer 4. The body region 6 is in contact with the drain region 5. A p-type impurity concentration of the body region 6 is $1 \times 10^{16}$ to $1 \times 10^{19}$ cm⁻³, for example.

A gate trench 7 is formed dug down in the epitaxial layer 4. The gate trench 7 is formed plurally spaced apart at predetermined intervals although not shown in FIG. 1. The gate trenches 7 are paralleled with each other, extend in the same direction (a direction perpendicular to the sheet of FIG. 1, hereinafter, the direction is sometimes referred to as a direction along a gate width) and form a striped structure, for example.

The gate trench 7 penetrates through the body region 6 in a layer thickness direction, and the deepest portion (a bottom face) thereof reaches the drain region 5.

A gate insulating film 8 composed of SiO₂ is formed on an inner surface of the gate trench 7 and the front face 41 of the epitaxial layer 4 so as to cover throughout the inner surface of the gate trench 7.

The inside of the gate insulating film 8 is filled up with a polysilicon material doped with an n-type impurity, whereby a gate electrode 9 is embedded within the gate trench 7.

n⁺-type source regions 10 are formed at both sides of the gate trench 7 in a direction orthogonal to the gate width (a right-left direction in FIG. 1) on the surface layer portion of the body region 6. The source region 10 is a region that is higher in n-type impurity concentration than the drain region 5 and is doped with a highly concentrated n-type impurity. An n-type impurity concentration of the source region 10 is $1 \times 10^{18}$ to $1 \times 10^{21}$ cm⁻³, for example. The source region 10 extends in the direction along the gate width in a position adjacent to the gate trench 7, and a bottom portion thereof is in contact with the body region 6.

Further, a p⁺-type body contact region 11 penetrating from the front face 41 of the epitaxial layer 4 through a central portion of the source region 10 in the direction orthogonal to the gate width and connected to the body region 6 is formed on the epitaxial layer 4. The body contact region 11 is a region that is higher in p-type impurity concentration than the body region 6 and is doped with a highly concentrated p-type impurity. A p-type impurity concentration of the body contact region 11 is $1 \times 10^{18}$ to $1 \times 10^{21}$ cm⁻³, for example.

More specifically, the gate trenches 7 and the source regions 10 are provided alternately in the gate width orthogonal direction and extend in the direction along the gate width, respectively. On the source region 10, a boundary between unit cells adjacent to each other in the gate width orthogonal direction is provided along the source region 10. The body contact region 11 straddles between the two unit cells adjacent in the gate width orthogonal direction and at least one or more is provided. The boundary between the unit cells adjacent in the gate width direction is configured such that the gate electrode 9 contained in each unit cell has a fixed gate width.

An interlayer insulating film 12 composed of SiO₂ is laminated on the epitaxial layer 4. A source electrode 14 is connected to the source region 10 and the body contact region 11 via a contact hole 13 formed in the interlayer insulating film 12. The source electrode 14 includes, for example, a source metal 15 composed of a metal material containing Al as a main ingredient and an ohmic metal 16 formed under the source metal 15 and composed of Ni.

A drain electrode 17 as a metal layer is formed on the rear face 22 of the SiC substrate 2. The drain electrode 17 is directly bonded to the high carbon concentration SiC layer 3. The drain electrode 17 can be formed, for example, by a laminated structure (Ti/Ni/Ag) laminated with a titanium layer (Ti), a nickel layer (Ni) and a silver layer (Ag) in this order, a laminated structure (Ti/Ni/Ag/Au) further laminated with a gold layer (Au) on the Ti/Ni/Ag laminated structure, a laminated structure (Ti/Ni/Al) laminated with a titanium layer (Ti), a nickel layer (Ni) and an aluminum layer (Al) in this order, etc.

A predetermined voltage (a voltage exceeding a gate threshold voltage) is applied to the gate electrode 9 in a state of generating a predetermined potential difference between the source electrode 14 and the drain electrode 17 (between the source and the drain), whereupon an electric field from the gate electrode 9 forms a channel in the vicinity of an interface with the gate insulating film 8 in the body region 6. As a result, current flows between the source electrode 14 and the drain electrode 17, and the VDMOSFET is brought into an ON state.

In the first embodiment, the body region 6, the gate trench 7, the gate insulating film 8 and the gate electrode 9 constitute a gate as a broader concept. The source region 10 and the source electrode 14 constitute a source as a broader concept. The SiC substrate 2, the drain region 5 and the drain electrode 17 constitute a drain as a broader concept.

Figure 2A:
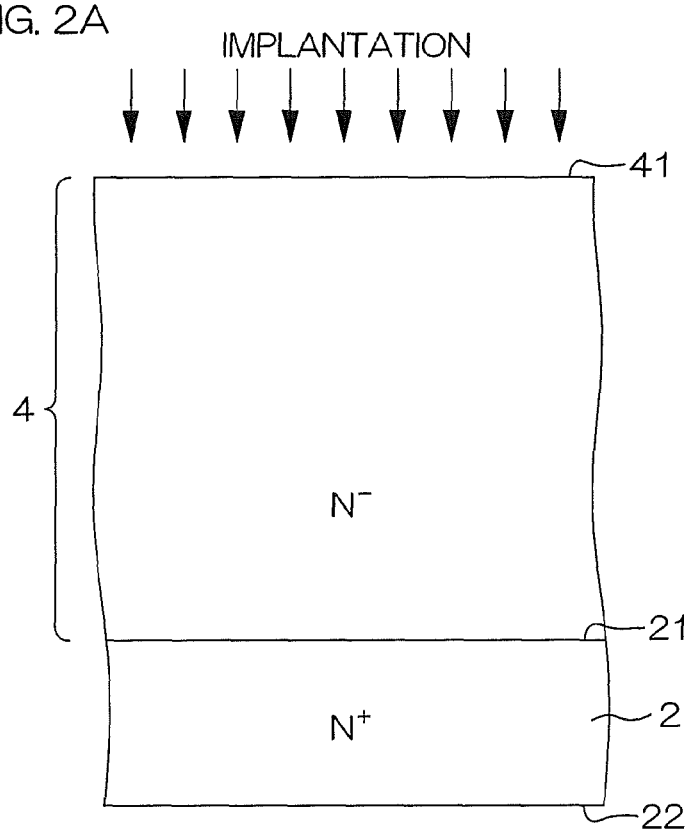
FIGS. 2A to 2P are schematic cross-sectional views for explaining a manufacturing method of the semiconductor device of FIG. 1 in step order.
Figure 2B:
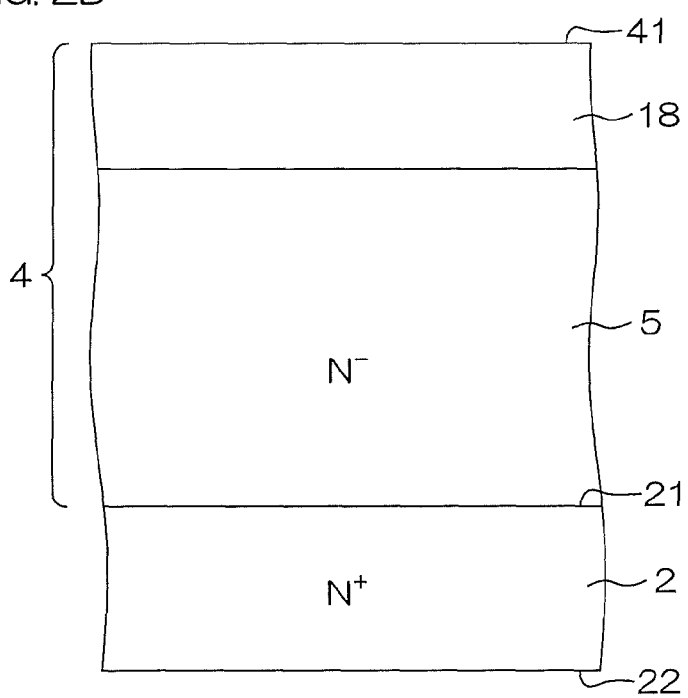
Figure 2C:
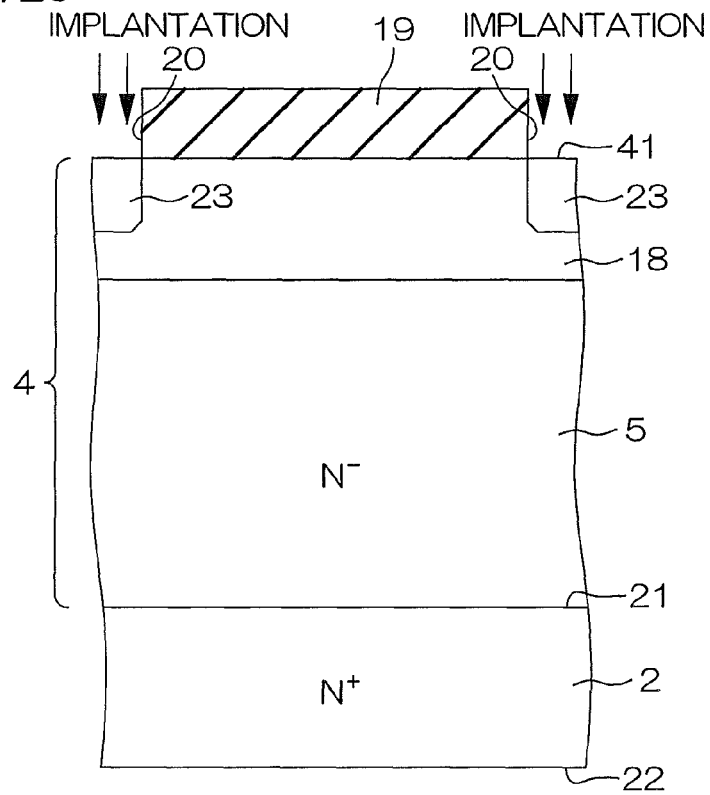
Figure 2D:
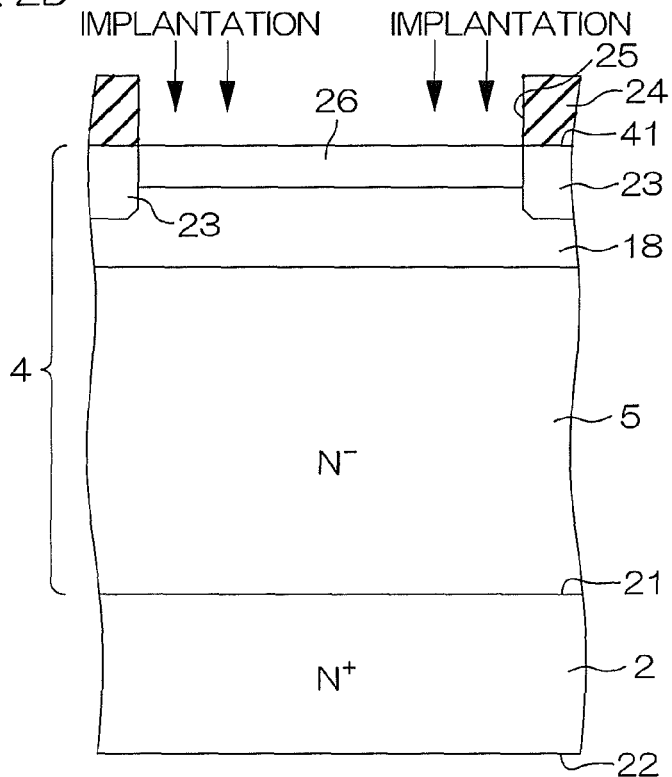
Figure 2F:
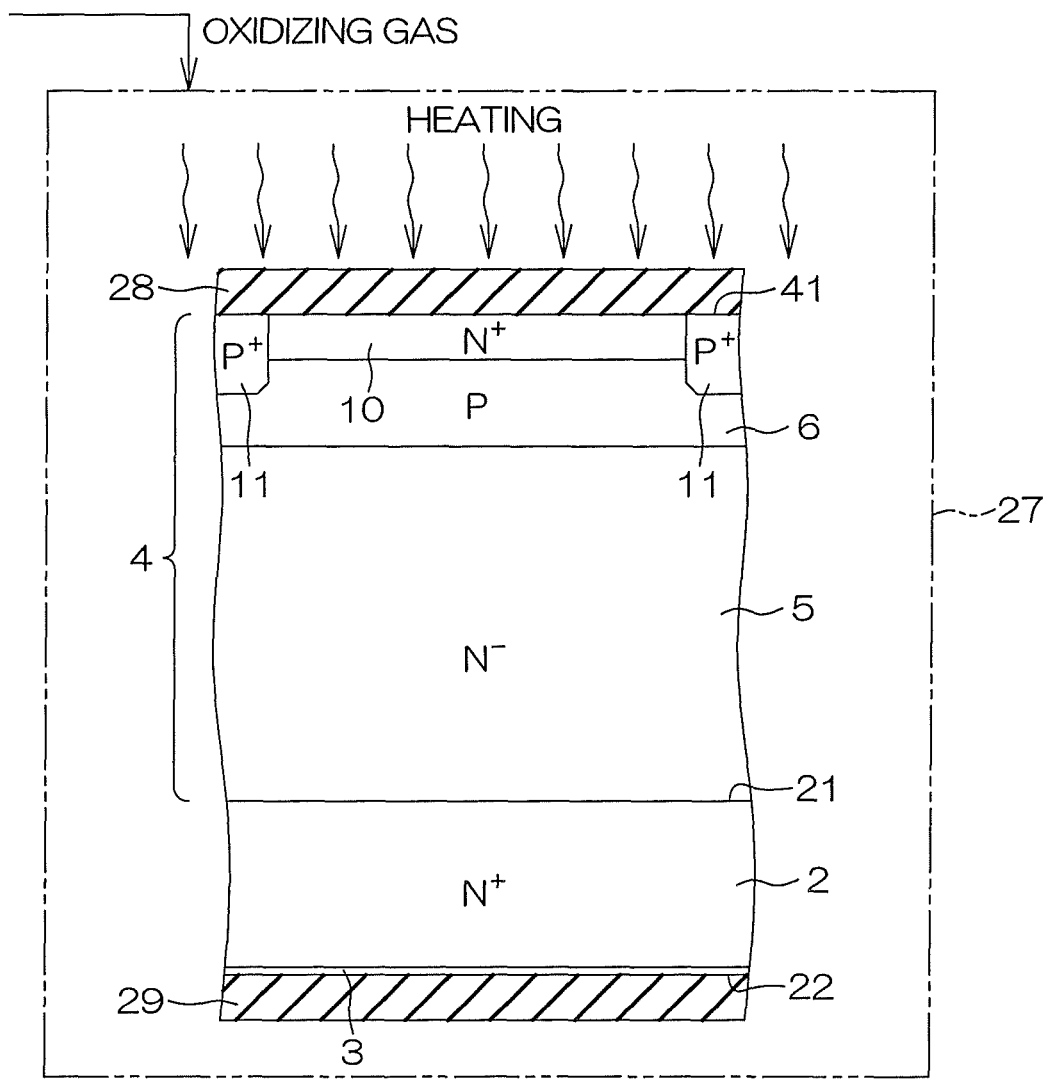
Figure 2G:
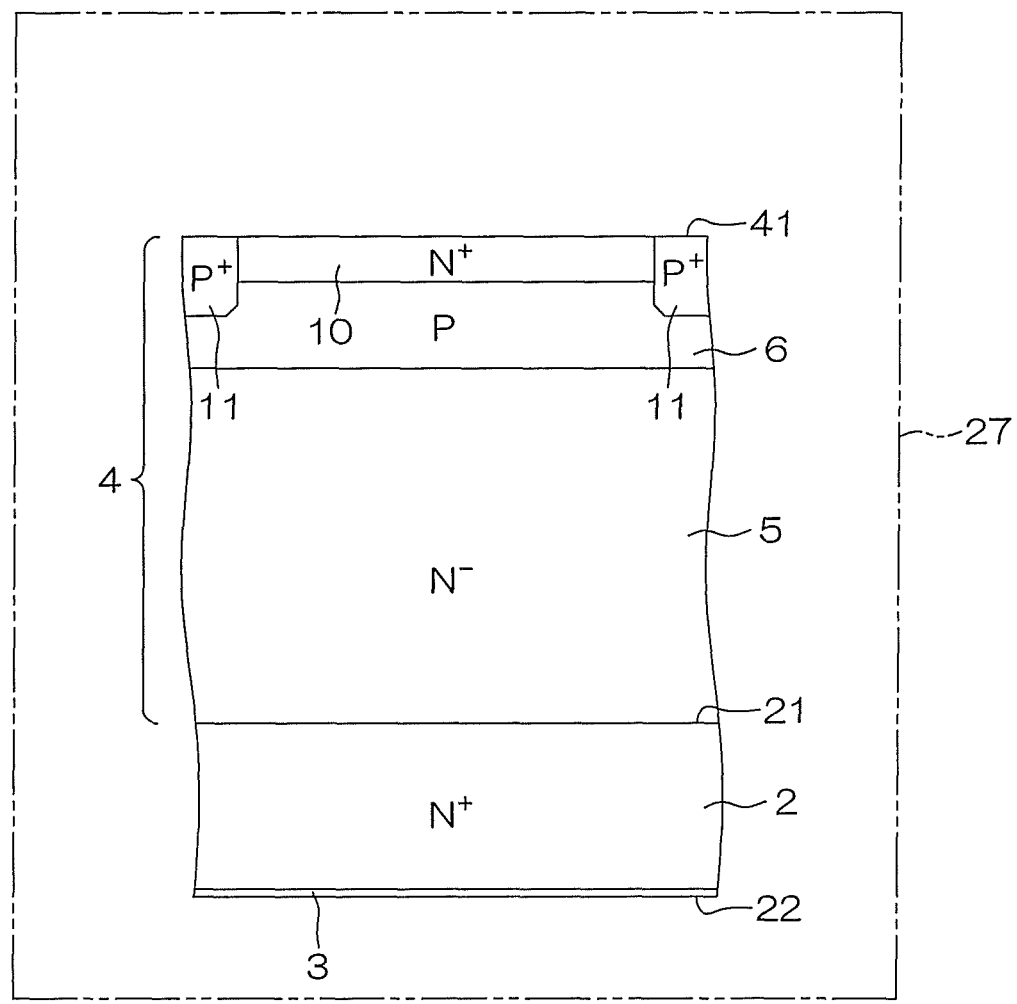
Figure 2H:
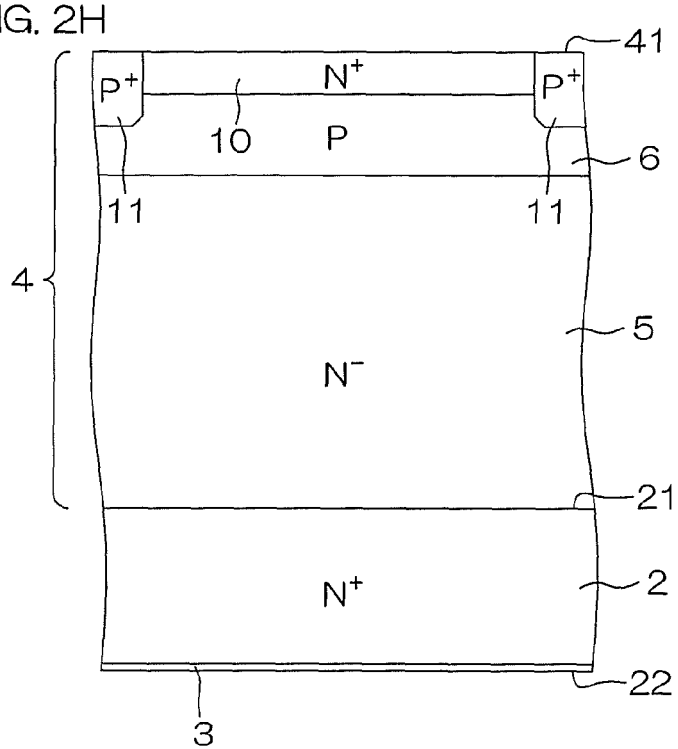
Figure 2I:
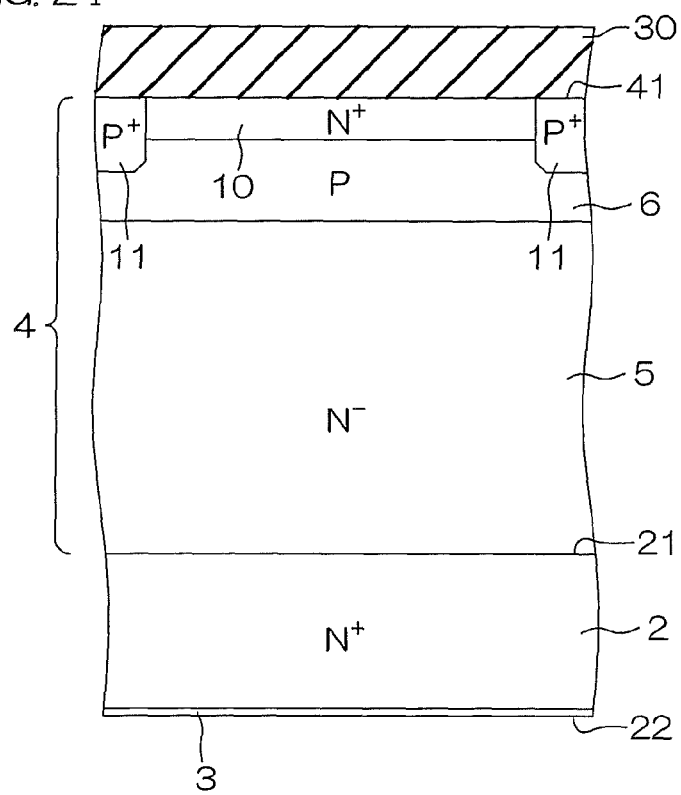
Figure 2J:
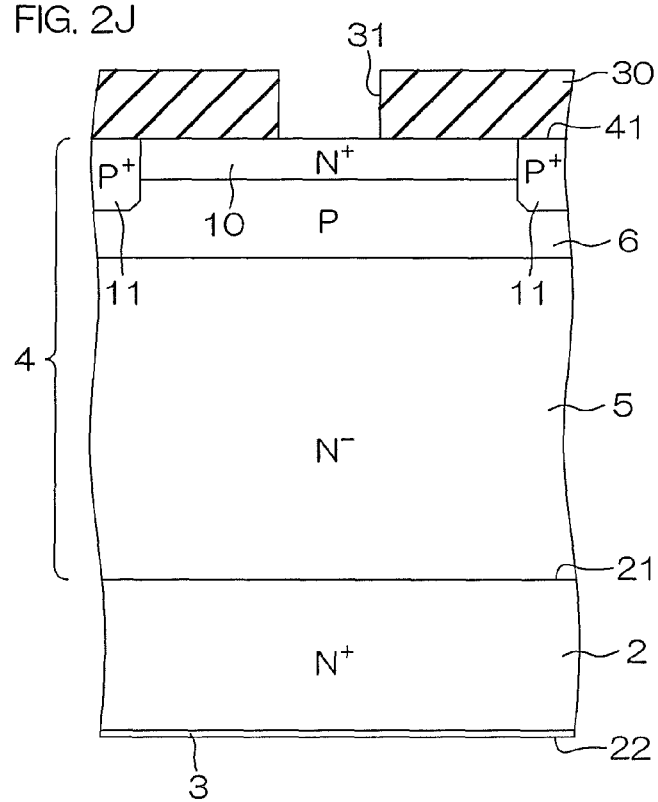
Figure 2K:
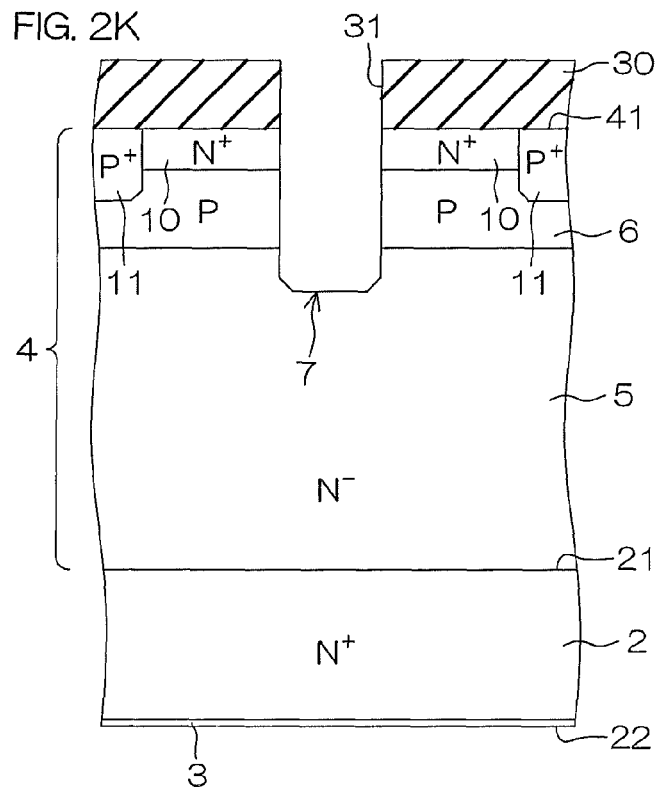
Figure 2L:
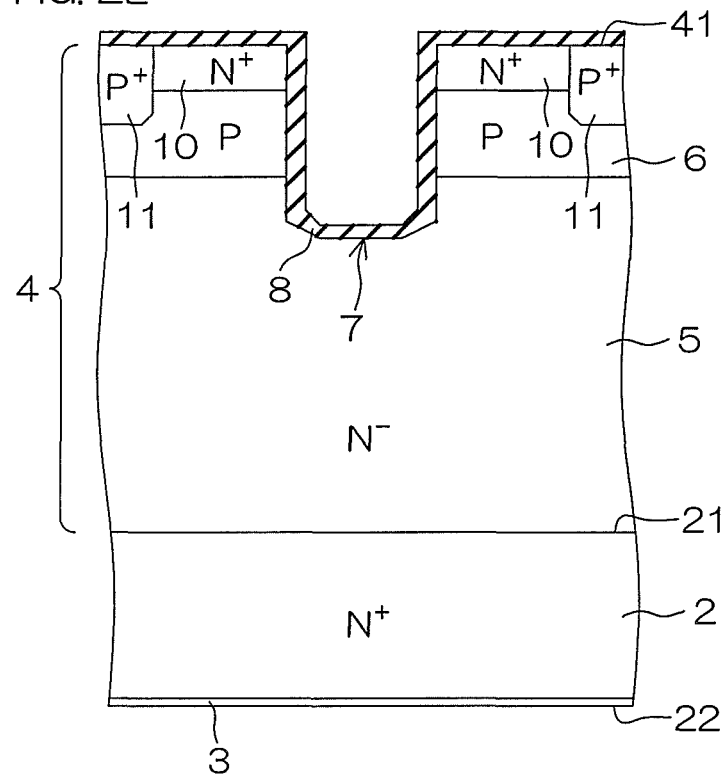
Figure 2M:
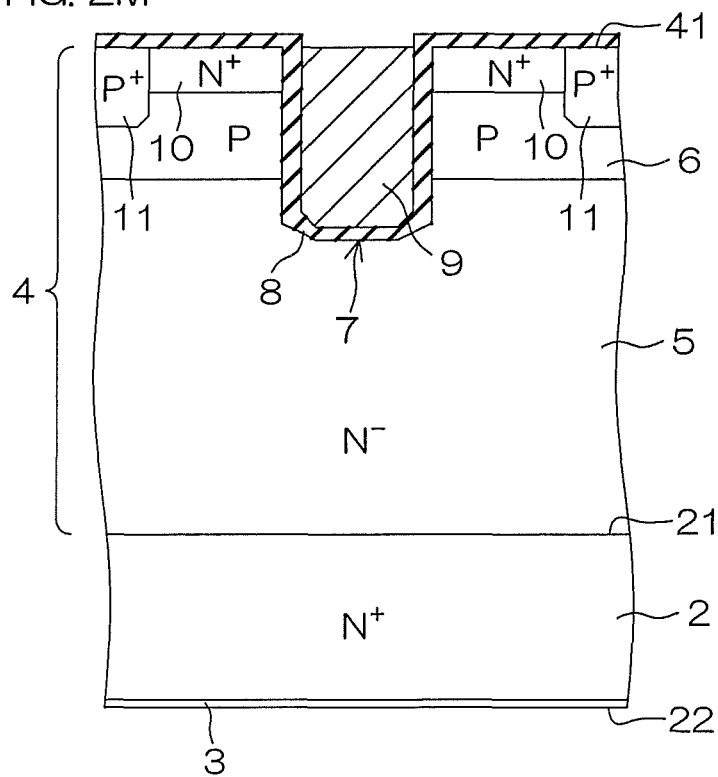
Figure 2N:
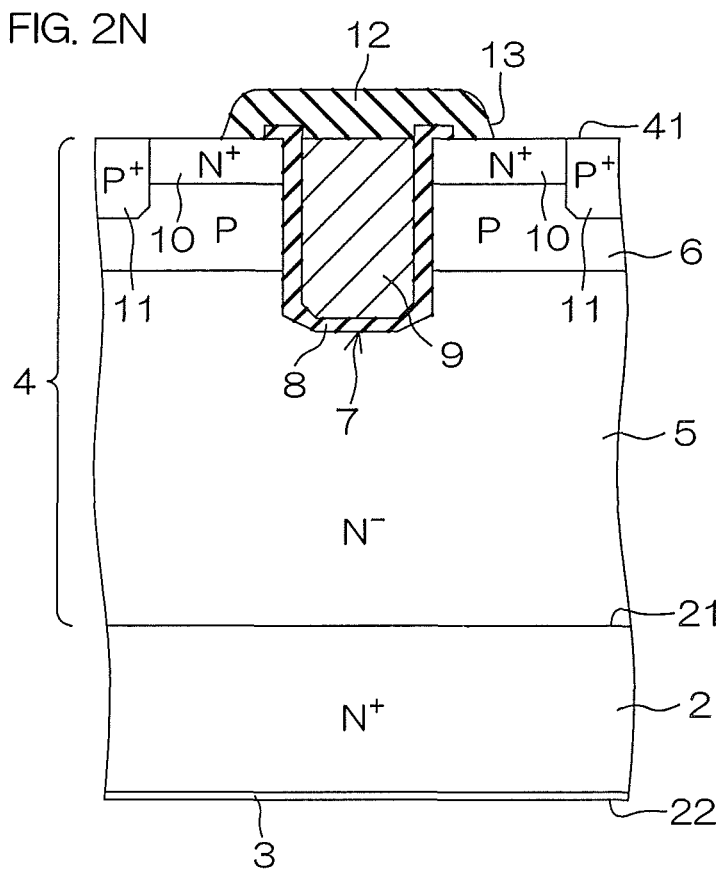
Figure 20:
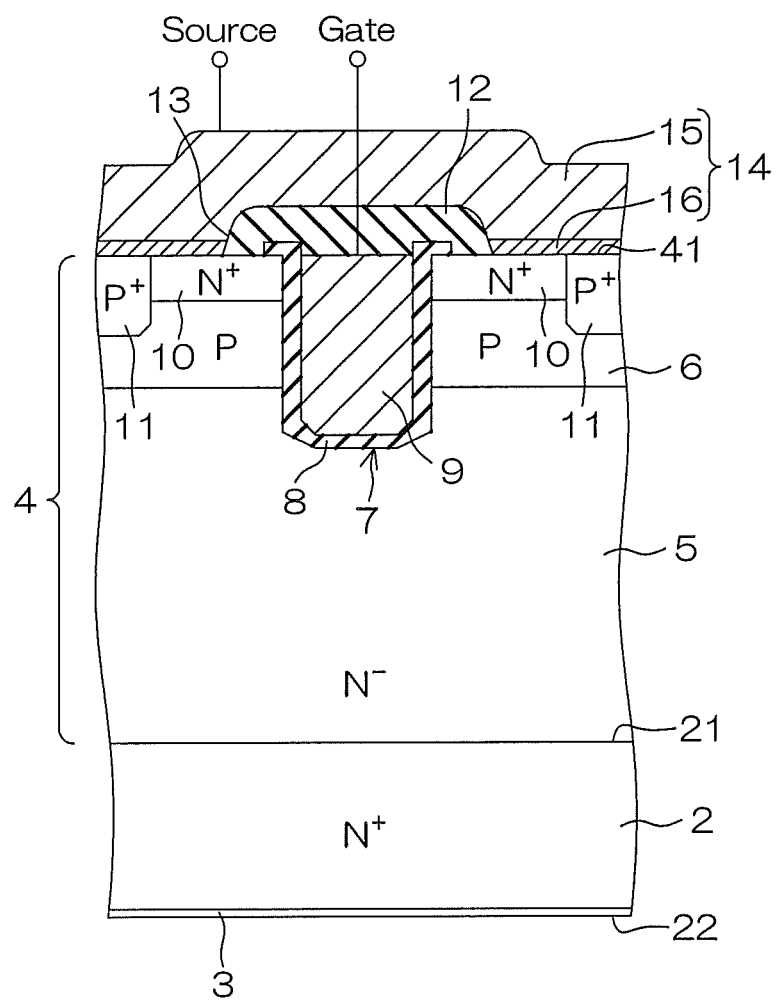
Figure 2P:
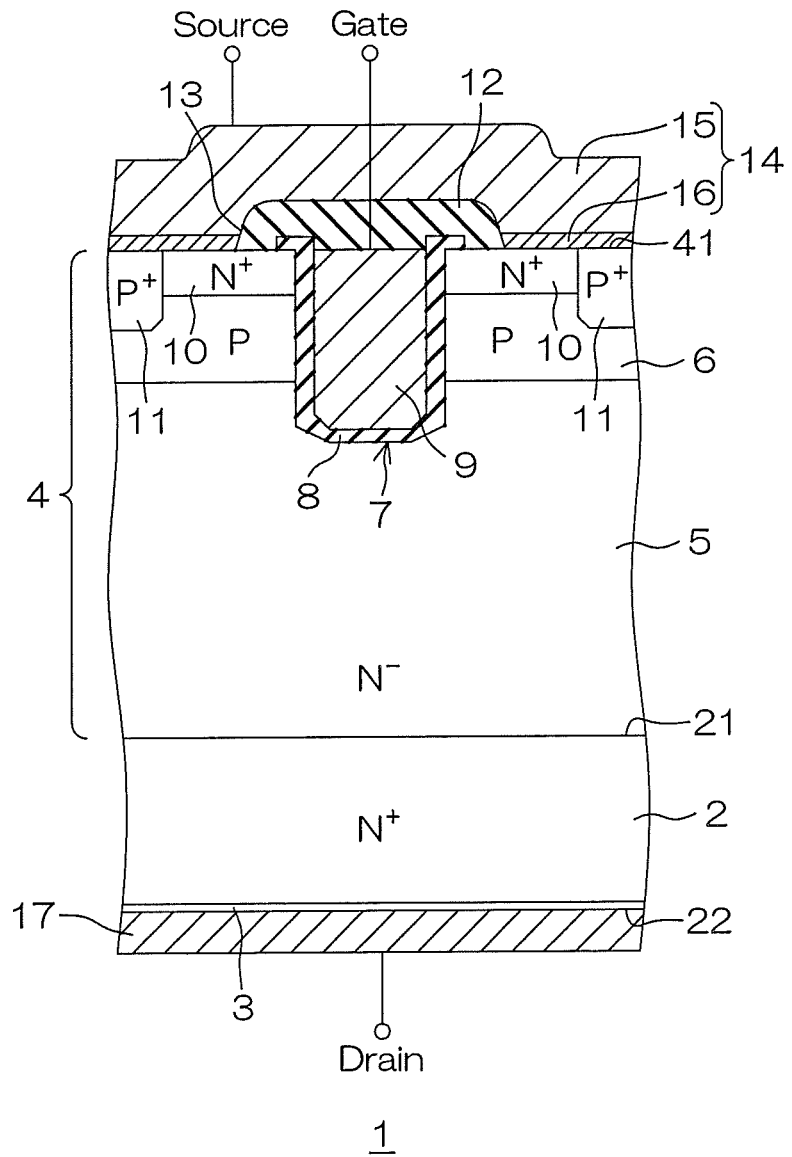

FIGS. 2A to 2P are schematic cross-sectional views for explaining a manufacturing method of the semiconductor device of FIG. 1 in step order.

First, as shown in FIG. 2A, a SiC crystal is made grown on the front face 21 (Si face) of the SiC substrate 2 with an impurity doped, by an epitaxial growth method such as a CVD (Chemical Vapor Deposition) method, an LPE (Liquid Phase Epitaxy) method, an MBE (Molecular Beam Epitaxy) method, etc. As a result, an n⁻-type epitaxial layer 4 is formed on the SiC substrate 2. Subsequently, a p-type impurity is implanted (injected) into the epitaxial layer 4 from the front face 41 thereof. An injection condition at this moment is different depending on the kind of p-type impurity, but, for example, that an acceleration energy is 200 keV to 400 keV.

Consequently, as shown in FIG. 2B, a region implanted with the p-type impurity (a p-type implantation region 18) is formed on the surface layer portion of the epitaxial layer 4. By the formation of the p-type implantation region 18, a drain region 5 separated from the p-type implantation region 18 and maintaining a state of post-epitaxial growth is formed on the base layer portion of the epitaxial layer 4.

Next, as shown in FIG. 2C, a mask 19 composed of $SiO_2$ is formed on the epitaxial layer 4 by the CVD method. Subsequently, the mask 19 is patterned by etching via a photoresist (not shown) into a pattern having an opening 20 opposed to a region to be formed with a body contact region 11. After the patterning, a p-type impurity is implanted (injected) into the epitaxial layer 4 from the front face 41 thereof. An injection condition at this moment is different depending on the kind of p-type impurity, but, for example, that an acceleration energy is 30 keV to 200 keV. Consequently, a region implanted with the highly concentrated p-type impurity (a $p^+$-type implantation region 23) is formed on a surface layer portion of the p-type implantation region 18. The mask 19 is removed after the injection of the p-type impurity.

Next, as shown in FIG. 2D, a mask 24 composed of $SiO_2$ is formed on the epitaxial layer 4 by the CVD method. Subsequently, the mask 24 is patterned by etching via a photoresist (not shown) into a pattern having an opening 25 opposed to a region to be formed with a source region 10. After the patterning, an n-type impurity is implanted (injected) into the epitaxial layer 4 from the front face 41 thereof. An injection condition at this moment is different depending on the kind of n-type impurity, but, for example, that an acceleration energy is 30 keV to 200 keV. The mask 24 is removed after the injection of the n-type impurity. As a result, a region implanted with the highly concentrated n-type impurity (an $n^+$-type implantation region 26) is formed on the surface layer portion of the p-type implantation region 18.

Next, as shown in FIG. 2E, the SiC substrate 2 is carried into a heating furnace 27. After being carried in, the SiC substrate 2 is treated with heat in a condition of, for example, 1400° C. or higher, preferably 1600 to 2000° C., and more preferably 1700 to 1800° C. for, for example, 1 to 60 minutes and preferably 3 to 5 minutes, while an inert gas (for example, $N_2$, Ar, etc.) is introduced into the heating furnace 27.

As a result of this, Si in SiC is sublimated from the rear face 22 (C face) of the SiC substrate 2, and a binding energy on the surface layer portion of the rear face 22 side shifts to a higher binding energy side than a binding energy specific to SiC, whereby a high carbon concentration SiC layer 3 (a high energy layer) is formed. Simultaneously, the heat treatment activates the n-type and the p-type impurity having been injected, whereupon a body region 6 is formed on the surface layer portion of the epitaxial layer 4 and also a source region 10 and a body contact region 11 are formed on a surface layer portion of the body region 6.

After the heat treatment, as shown in FIG. 2F, the SiC substrate 2 is oxidized (for example, thermally oxidized) at, for example, 900 to 1400° C. for, for example, 10 to 600 minutes, while an oxidizing gas (for example, $O_2$, etc.) is introduced into the heating furnace 27. As a result, oxide films 28, 29 are formed on the front face 21 and the rear face 22 of the SiC substrate 2, respectively.

Next, as shown in FIG. 2G, the oxide films 28, 29 are removed. With this, even if a carbon layer composed of carbon is formed on the surface layer portion of the rear face 22 side due to an excessive increase in temperature during the heat treatment, the carbon layer can be removed together with the oxide film 29.

After that, as shown in FIG. 2H, the SiC substrate 2 is taken out from the heating furnace 27.

Next, as shown in FIG. 2I, a mask 30 composed of $SiO_2$ is formed on the entire front face 41 of the epitaxial layer 4 by the CVD method, etc. It is noted that the mask 30 can also be formed of SiN, etc.

Next, as shown in FIG. 2J, the mask 30 is patterned by etching via a photoresist (not shown) into a pattern having an opening 31 opposed to a region to be formed with a gate trench 7.

Next, as shown in FIG. 2K, a mixed gas (a $SF_6/O_2$/HBr gas) containing $SF_6$ (sulfur hexafluoride), $O_2$ (oxygen) and HBr (hydrogen bromide) is injected into the front face 41 of the epitaxial layer 4 via the opening 31. As a result, the epitaxial layer 4 is dry etched from the front face 41 (Si face) to form a gate trench 7. The mask 30 is removed after the gate trench 7 is formed.

Next, as shown in FIG. 2L, an inner surface of the gate trench 7 and the front face 41 of the epitaxial layer 4 are oxidized by thermal oxidation, whereby a gate insulating film 8 is formed.

Next, as shown in FIG. 2M, a doped polysilicon material is deposited on the epitaxial layer 4 by the CVD method. The deposited polysilicon material is etched back until the etched back surface becomes flush with the front face 41 of the epitaxial layer. As a result, a portion of the polysilicon material outside the gate trench 7 is removed, and a gate electrode 9 composed of the polysilicon material remaining within the gate trench 7 is formed.

Next, as shown in FIG. 2N, an interlayer insulating film 12 composed of $SiO_2$ is laminated on the epitaxial layer 4 by the CVD method. The interlayer insulating film 12 and the gate insulating film 8 are patterned, whereby a contact hole 13 exposing the source region 10 is formed on the interlayer insulating film 12 and the gate insulating film 8.

Next, as shown in FIG. 2O, an ohmic metal 16 and a source metal 15 are deposited in this order by a method such as sputtering, vapor deposition, etc., and a source electrode 14 is connected to the source region 10 and the body contact region 11.

Next, as shown in FIG. 2P, a material for the drain electrode 17 is deposited on the rear face 22 of the SiC substrate 2 by a method such as sputtering, vapor deposition, etc., and a drain electrode 17 is bonded to the front face of the high carbon concentration SiC layer 3.

The semiconductor device 1 as shown in FIG. 1 is obtained after going through the above steps.

According to the semiconductor device 1, as described above, the drain electrode 17 is directly bonded to the rear face 22 of the SiC substrate 2, so that a silicide layer or a carbon layer does not intervene between the SiC substrate 2 and the drain electrode 17. Consequently, layer delamination between the SiC substrate 2 and the drain electrode 17 can be prevented, which resultingly allows connection reliability of the drain electrode 17 to the SiC substrate 2 to be improved.

Further, a layer composed of SiC containing more highly concentrated carbon than the surface layer portion of the front face 21 side (a high carbon concentration SiC layer 3) is formed on the surface layer portion of the rear face 22 side of the SiC substrate 2. Thus, the drain electrode 17 can be ohmically contacted to the SiC substrate 2 as in the case of bonding SiC and metal via the silicide layer.

Further, the n-type impurity concentration of the SiC substrate 2 is $1\times10^{17}$ cm$^{-3}$ or more, and accordingly, the drain electrode 17 can be ohmically contacted to the SiC substrate 2 much better at a low resistance value.

According to the manufacturing method of the semiconductor device 1, the high carbon concentration SiC layer 3 is formed on the surface layer portion of the rear face 22 side of the SiC substrate 2, and the material for the drain electrode 17 is deposited on the rear face 22, whereby the drain electrode 17 is directly bonded to the front face of the high carbon concentration SiC layer 3. Since a silicide layer is not formed on the rear face 22 of the SiC substrate 2, the step for removing the carbon layer on the silicide layer does not need to be carried out. Consequently, an increase in the number of steps can be prevented, and resultingly an increase in manufacturing costs can be suppressed.

Further, the heat treatment is carried out in a temperature condition of 1400° C. or higher, so that Si atoms in SiC can be sublimated efficiently from the rear face 22 side (carbon face side) of the SiC substrate 2. Further, the injected n-type and p-type impurities can be activated in parallel with the formation of the high carbon concentration SiC layer 3 during the heat treatment step at 1400° C. or higher. Since the heat treatment step and the activation step can be integrated into one step, the number of steps can be reduced. As a result, manufacturing costs can be reduced. Furthermore, impurity regions (for example, the body region 6, the source region 10, the body contact region 11, etc.) after the activation can be prevented from being subjected to high temperatures. Consequently, device characteristics of the semiconductor device 1 can be stabilized.

Figure 3:
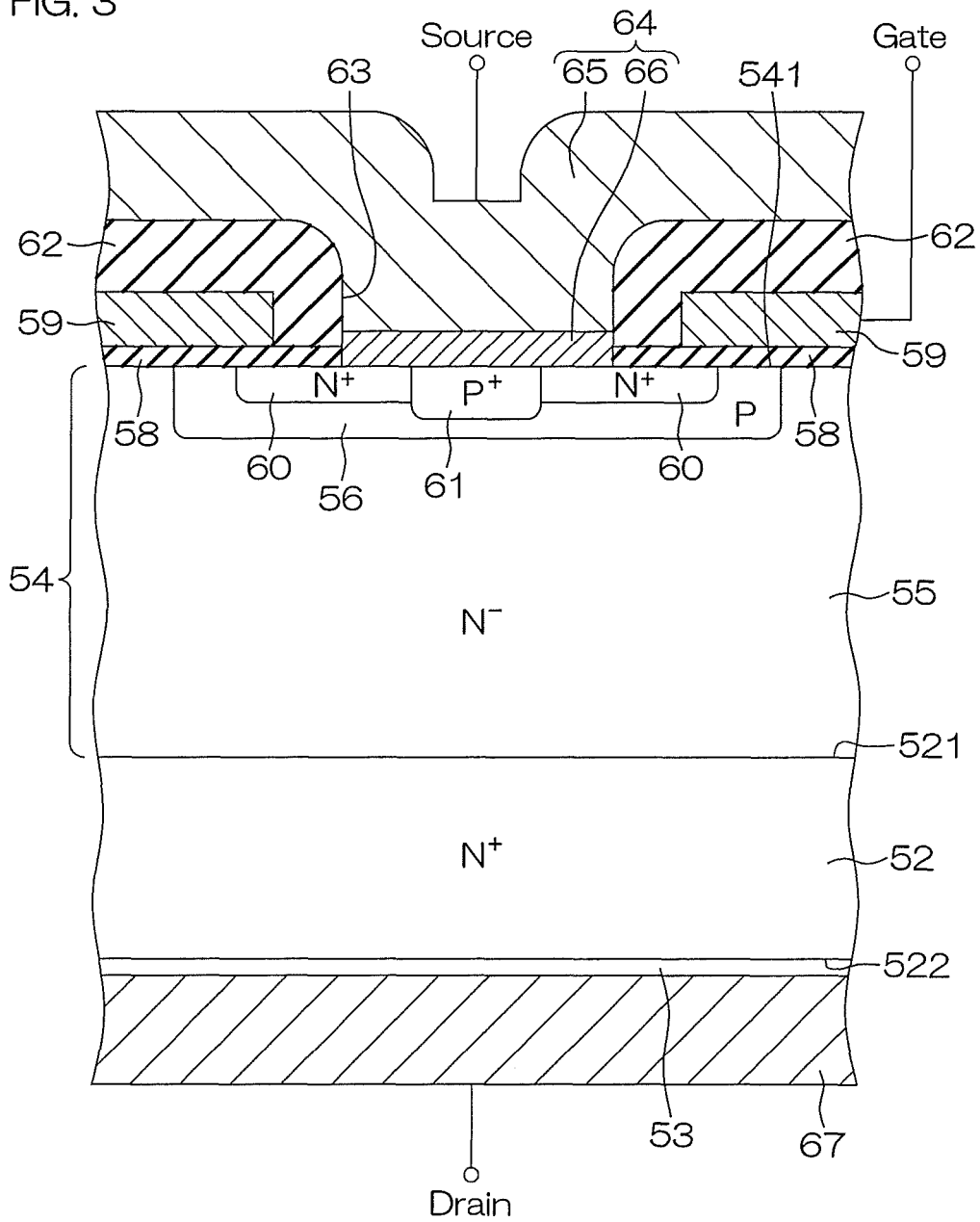
FIG. 3 is a schematic cross-sectional view of a semiconductor device (a planar gate VDMOSFET) according to a second embodiment of the present invention.

FIG. 3 is a schematic cross-sectional view of a semiconductor device (a planar gate VDMOSFET) according to a second embodiment of the present invention.

A semiconductor device 51 has a structure in which a plurality of unit cells of a planar gate VDMOSFET are arranged. It is noted that a part of the plurality of unit cells is shown in FIG. 3.

The semiconductor device 51 is provided with a SiC substrate 52 as a semiconductor substrate which forms a base thereof. The SiC substrate 52 is doped with a highly concentrated n-type impurity. A concentration of the n-type impurity is $1\times10^{17}$ cm$^{-3}$ or more, for example, and preferably $1\times10^{18}$ to $1\times10^{21}$ cm$^{-3}$. The SiC substrate 52 has a front face 521 (the other face) being a Si (silicon) face and a rear face 522 (one face) being a C (carbon) face. A thickness of the SiC substrate 52 is 100 μm to 400 μm, for example.

A surface layer portion at the rear face 522 side of the SiC substrate 52 is formed with a layer composed of SiC containing more highly concentrated carbon than a surface layer portion at the front face 521 side (a high carbon concentration SiC layer 53).

A composition ratio of C to Si (C/Si) in the high carbon concentration SiC layer 53 is such that a composition ratio of C (C1s) in is orbital to Si (Si2s) in 2s orbital (C1s/Si2s) is, for example, 1.1 to 1.2, and preferably 1.15 to 1.2. Further, a composition ratio of C1s to Si (Si2p) in 2p orbital (C1s/Si2p) is, for example, 1.2 to 1.4, and preferably 1.2 to 1.25.

The high carbon concentration SiC layer 53 having the composition ratios in the above ranges is a high energy layer having a higher binding energy than that specific to SiC, for example. Peaks in Si-2s orbital, Si-2p orbital and C-1s orbital analyzed by XPS (X-ray Photoelectron Spectroscopy) shift to a high binding energy side by, for example, 0.2 eV to 1 eV, and preferably 0.4 eV to 0.6 eV with respect to a relevant peak (a peak specific to SiC) of a portion excluding the high carbon concentration SiC layer 53 in the SiC substrate 52 (for example, the surface layer portion on the front face 521 side).

Further, a thickness of the high carbon concentration SiC layer 53 is, for example, on the order of $2.5\times10^{-4}$ to $1\times10^{-2}$% to that of the SiC substrate 52, and more specifically, 1 nm to 10 nm, for example.

An n$^-$-type epitaxial layer 54 composed of SiC having been doped with a lower concentration of an n-type impurity than the SiC substrate 52 is laminated on the front face 521 of the SiC substrate 52. The epitaxial layer 54 formed on the front face 521 being a Si face grows with the Si face being as a growth principal surface. Thus, a front face 541 of the epitaxial layer 54 is a Si face.

A portion at the C face side (a base layer portion) opposite to a portion at the Si face side (a surface layer portion) in the epitaxial layer 54 forms an n$^-$-type drain region 55 where the whole portion is kept in a state of the post-epitaxial growth. An n-type impurity concentration of the drain region 55 is $1\times10^{15}$ to $1\times10^{17}$ cm$^{-3}$, for example.

On the other hand, a p-type body region (well region) 56 is formed plurally on the surface layer portion of the epitaxial layer 54. The plurality of body regions 56 have, for example, a tetragonal shape (a substantially square shape) when viewed in a plane, and are arrayed in the shape of a matrix. Each body region 56 is in contact with the drain region 55. A p-type impurity concentration of the body region 56 is $1\times10^{16}$ to $1\times10^{19}$ cm$^{-3}$, for example. It is noted that the plurality of body regions 56 may be arrayed in the shape of stripes which extend parallel to each other.

An n$^+$-type source region 60 is formed on a surface layer portion of each body region 56 while spaced apart from a periphery of the body region 56. The source region 60 is a region that is higher in n-type impurity concentration than the drain region 55 and is doped with a highly concentrated n-type impurity. An n-type impurity concentration of the source region 60 is $1\times10^{18}$ to $1\times10^{21}$ cm$^{-3}$, for example.

A p$^+$-type body contact region 61 doped with a more highly concentrated p-type impurity than the body region 56 is formed inside each source region 60. Each body contact region 61 is formed penetrating through the source region 60 in a depth direction. The body contact region 61 is a region that is higher in p-type impurity concentration than the body region 56 and is doped with a highly concentrated p-type impurity. A p-type impurity concentration of the body contact region 61 is $1\times10^{18}$ to $1\times10^{21}$ cm$^{-3}$, for example.

A gate insulating film 58 composed of SiO$_2$ is formed on the front face 541 of the epitaxial layer 54. The gate insulating film 58 straddles between adjacent body regions 56 and covers a portion encompassing the source region 60 in the body region 56 (a peripheral portion of the body region 56) and an outer periphery of the source region 60.

A gate electrode 59 is formed on the gate insulating film 58. The gate electrode 59 is formed in a lattice shape along the lattice shaped gate insulating film 58, and faces the peripheral portion of each body region 56 with the gate insulating film 58 interposed therebetween. The gate electrode 59 is composed of polysilicon doped with an n-type impurity, for example.

An interlayer insulating film 62 composed of SiO$_2$ is laminated on the epitaxial layer 54. A source electrode 64 is connected to the source region 60 and the body contact region 61 via a contact hole 63 formed in the interlayer insulating film 62. The source electrode 64 includes, for example, a source metal 65 composed of a metal material containing Al as a main ingredient and an ohmic metal 66 formed under the source metal 65 and composed of Ni.

A drain electrode 67 as a metal layer is formed on the rear face 522 of the SiC substrate 52. The drain electrode 67 is directly bonded to the high carbon concentration SiC layer 53. The drain electrode 67 can be formed, for example, by a laminated structure (Ti/Ni/Ag) laminated with a titanium layer (Ti), a nickel layer (Ni) and a silver layer (Ag) in this order, a laminated structure (Ti/Ni/Ag/Au) further laminated with a gold layer (Au) on the Ti/Ni/Ag laminated structure, a laminated structure (Ti/Ni/Al) laminated with a titanium layer (Ti), a nickel layer (Ni) and an aluminum layer (Al) in this order, etc.

A predetermined voltage (a voltage exceeding a gate threshold voltage) is applied to the gate electrode 59 in a state of generating a predetermined potential difference between the source electrode 64 and the drain electrode 67 (between the source and the drain), whereupon an electric field from the gate electrode 59 forms a channel in the vicinity of an interface with the gate insulating film 58 in the body region 56. As a result, current flows between the source electrode 64 and the drain electrode 67, and the VDMOSFET is brought into an ON state.

In the second embodiment, the body region 56, the gate insulating film 58 and the gate electrode 59 constitute a gate as a broader concept. The source region 60 and the source electrode 64 constitute a source as a broader concept. The SiC substrate 52, the drain region 55 and the drain electrode 67 constitute a drain as a broader concept.

By this semiconductor device 51 structure, the drain electrode 67 is directly bonded to the rear face 522 of the SiC substrate 52 in the same manner as the semiconductor device 1, so that a silicide layer or a carbon layer does not intervene between the SiC substrate 52 and the drain electrode 67. Consequently, layer delamination between the SiC substrate 52 and the drain electrode 67 can be prevented, which resultingly allows connection reliability of the drain electrode 67 to the SiC substrate 52 to be improved.

Further, a layer composed of SiC containing more highly concentrated carbon than the surface layer portion of the front face 521 side (a high carbon concentration SiC layer 53) is formed on the surface layer portion of the rear face 522 side of the SiC substrate 52. Thus, the drain electrode 67 can be ohmically contacted to the SiC substrate 52 as in the case of bonding SiC and metal via the silicide layer.

In order to manufacture the semiconductor device 51, first, as following the steps as shown in FIGS. 2A to 2D, impurities are implanted into regions to be formed with the body region 56, the source region 60 and the body contact region 61 in the epitaxial layer 54. Next, as following the step as shown in FIG. 2E, the SiC substrate 52 is carried into the heating furnace 27 and then treated with heat. As a result, a high carbon concentration SiC layer 53 is formed while a body region 56, a source region 60 and a body contact region 61 are formed. After that, the steps as shown in FIG. 2F and FIG. 2G are gone through, and then a gate electrode 59, a source electrode 64 and a drain electrode 67 have only to be formed.

In manufacturing the semiconductor device 51 as well, the same operation and effect as that by the manufacturing steps of the semiconductor device 1 can be exhibited.

More specifically, a silicide layer is not formed on the rear face 522 of the SiC substrate 52, so that the step for removing the carbon layer on the silicide layer does not need to be carried out. Consequently, an increase in the number of steps can be prevented.

Further, the heat treatment of the SiC substrate 52 is carried out in a temperature condition of 1400° C. or higher, so that Si atoms in SiC can be sublimated efficiently from the rear face 522 side (carbon face side) of the SiC substrate 52. Further, the injected n-type and p-type impurities can be activated in parallel with the formation of the high carbon concentration SiC layer 53 during the heat treatment step at 1400° C. or higher. Since the heat treatment step and the activation step can be integrated into one step, the number of steps can be reduced. Furthermore, impurity regions (for example, the body region 56, the source region 60, the body contact region 61, etc.) after the activation can be prevented from being subjected to high temperatures. Consequently, device characteristics of the semiconductor device 51 can be stabilized.

Figure 4:
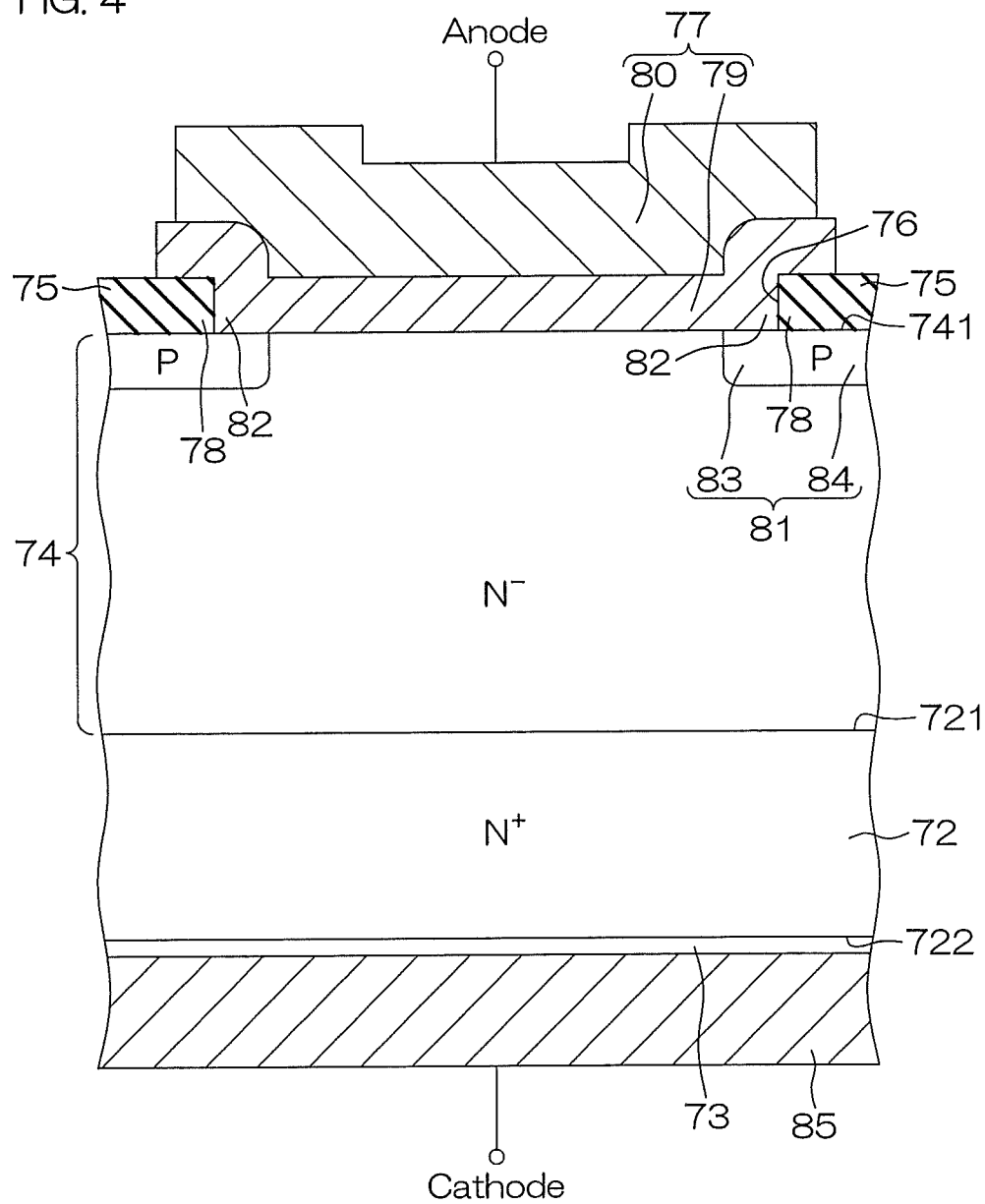
FIG. 4 is a schematic cross-sectional view of a Schottky barrier diode according to a third embodiment of the present invention.

FIG. 4 is a schematic cross-sectional view of a Schottky barrier diode according to a third embodiment of the present invention.

A Schottky barrier diode 71 as a semiconductor device is provided with a SiC substrate 72 as a semiconductor substrate which forms a base thereof. The SiC substrate 72 is doped with a highly concentrated n-type impurity. A concentration of the n-type impurity is $1 \times 10^{17}$ cm$^{-3}$ or more, for example, and preferably $1 \times 10^{18}$ to $1 \times 10^{21}$ cm$^{-3}$. The SiC substrate 72 has a front face 721 (the other face) being a Si (silicon) face and a rear face 722 (one face) being a C (carbon) face. A thickness of the SiC substrate 72 is 100 μm to 400 μm, for example.

A surface layer portion at the rear face 722 side of the SiC substrate 72 is formed with a layer composed of SiC containing more highly concentrated carbon than a surface layer portion at the front face 721 side (a high carbon concentration SiC layer 73).

A composition ratio of C to Si(C/Si) in the high carbon concentration SiC layer 73 is such that a composition ratio of C (C1s) in is orbital to Si (Si2s) in 2s orbital (C1s/Si2s) is 1.1 to 1.2, for example, and preferably 1.15 to 1.2. Further, a composition ratio of C1s to Si(Si2p) in 2p orbital (C1s/Si2p) is 1.2 to 1.4, for example, and preferably 1.2 to 1.25.

The high carbon concentration SiC layer 73 having the composition ratios in the above ranges is a high energy layer having a higher binding energy than that specific to SiC, for example. Peaks in Si-2s orbital, Si-2p orbital and C-1s orbital analyzed by XPS (X-ray Photoelectron Spectroscopy) shift to a high binding energy side by 0.2 eV to 1 eV, for example, and preferably 0.4 eV to 0.6 eV with respect to a relevant peak (a peak specific to SiC) of a portion excluding the high carbon concentration SiC layer 73 in the SiC substrate 72 (for example, the surface layer portion on the front face 721 side).

Further, a thickness of the high carbon concentration SiC layer 73 is, for example, on the order of $2.5 \times 10^{-4}$ to $1 \times 10^{-2}$% to that of the SiC substrate 72, and more specifically, 1 nm to 10 nm, for example.

An n$^-$-type epitaxial layer 74 composed of SiC having been doped with a lower concentration of the n-type impurity than the SiC substrate 72 is laminated on the front face 721 of the SiC substrate 72. The epitaxial layer 74 formed on the front face 721 being a Si face grows with the Si face being as a growth principal surface. Thus, a front face 741 of the epitaxial layer 74 is a Si face.

A field insulating film 75 composed of silicon oxide (SiO$_2$) is laminated on the front face 741 of the epitaxial layer 74. A thickness of the field insulating film 75 is 5000 Å to 40000 Å, for example. It is noted that the field insulating film 75 may be composed of other insulating materials such as silicon nitride (SiN).

The field insulating film 75 is formed with an opening 76 exposing a central portion of the epitaxial layer 74. An anode electrode 77 is formed on the field insulating film 75.

The anode electrode 77 fills up the inside of the opening 76 of the field insulating film 75, and projects outward the opening 76 in a flange shape in such a manner as covering a peripheral portion 78 of the opening 76 in the field insulating film 75 from above. More specifically, the peripheral portion 78 of the field insulating film 75 is sandwiched by the epitaxial layer 74 and the anode electrode 77 throughout the entire periphery from both above and below thereof.

The anode electrode 77 has a two layer structure of a Schottky metal 79 bonded to the epitaxial layer 74 within the opening 76 of the filed insulating film 75 and a contact metal 80 laminated on the Schottky metal 79, for example.

The Schottky metal 79 is composed of a metal (for example, Mo, etc.) forming a Schottky junction by bonding with n-type SiC. The Schottky metal 79 bonded by SiC forms a Schottky barrier (potential barrier) with a height of, for example, 0.5 eV to 2.5 eV with the SiC semiconductor. Further, a thickness of the Schottky metal 79 is, for example, 0.1 μm to 1 μm in the third embodiment.

The contact metal 80 is a portion that is exposed to the outermost surface of the Schottky barrier diode 71 and is bonded with a bonding wire in the anode electrode 77. The contact metal 80 is composed of Al, for example. A thickness of the contact metal 80 is thicker than the Schottky metal 79 and 1 μm to 10 μm, for example, in the third embodiment.

Further, a p-type JTE (Junction Termination Extension) structure 81 is formed on the surface layer portion of the epitaxial layer 74 in such a manner as contacting with the Schottky metal 79 of the anode electrode 77. The JTE structure 81 is formed along an outline of the opening 76 of the field insulating film 75 so as to straddle inside and outside the opening 76. Thus, the JTE structure 81 has an inside portion 83 projecting inward the opening 76 and contacting to an outer peripheral portion 82 of the Schottky metal 79 within the opening 76 and an outside portion 84 projecting outward the opening 76 and facing the anode electrode 77 (Schottky metal 79) with the peripheral portion 78 of the field insulating film 75 interposed therebetween. A p-type impurity concentration of the JTE structure 81 becomes gradually low from the inside portion 83 toward the outside portion 84. More specifically, the impurity concentration is the highest around an inner edge of the JTE structure 81 and is the lowest around an outer edge of the JTE structure 81. It is noted that the JTE structure 81 may be a p-type guard ring doped with a uniformly concentrated p-type impurity.

A cathode electrode 85 as a metal layer is formed on the rear face 722 of the SiC substrate 72. The cathode electrode 85 is directly bonded to the high carbon concentration SiC layer 73. The cathode electrode 85 can be formed, for example, by a laminated structure (Ti/Ni/Ag) laminated with a titanium layer (Ti), a nickel layer (Ni) and a silver layer (Ag) in this order, a laminated structure (Ti/Ni/Ag/Au) further laminated with a gold layer (Au) on the Ti/Ni/Ag laminated structure, a laminated structure (Ti/Ni/Al) laminated with a titanium layer (Ti), a nickel layer (Ni) and an aluminum layer (Al) in this order, etc.

By this Schottky barrier diode 71 structure as well, the cathode electrode 85 is directly bonded to the rear face 722 of the SiC substrate 72 in the same manner as the semiconductor device 1 and the semiconductor device 51, so that a silicide layer or a carbon layer does not intervene between the SiC substrate 72 and the cathode electrode 85. Consequently, layer delamination between the SiC substrate 72 and the cathode electrode 85 can be prevented, which resultingly allows connection reliability of the cathode electrode 85 to the SiC substrate 72 to be improved.

Further, a layer composed of SiC containing more highly concentrated carbon than the surface layer portion of the front face 721 side (a high carbon concentration SiC layer 73) is formed on the surface layer portion of the rear face 722 side of the SiC substrate 72. Thus, the cathode electrode 85 can be ohmically contacted to the SiC substrate 72 as in the case of bonding SiC and metal via the silicide layer.

In order to manufacture the Schottky barrier diode 71, first, as following the steps as shown in FIGS. 2A to 2D, an impurity is gradually implanted into a region to be formed with the JTE structure 81 in the epitaxial layer 74. Next, as following the step as shown in FIG. 2E, the SiC substrate 72 is carried into the heating furnace 27 and then treated with heat. As a result, a high carbon concentration SiC layer 73 is formed while the JTE structure 81 is activated. After that, the steps as shown in FIG. 2F and FIG. 2G are gone through, and then an anode electrode 77 and a cathode electrode 85 have only to be formed. The cathode electrode 85 can be formed by following the forming method of the drain electrode 17 as shown in FIG. 2P.

In manufacturing the Schottky barrier diode 71 as well, the same operation and effect as that by the manufacturing steps of the semiconductor device 1 can be exhibited.

More specifically, a silicide layer is not formed on the rear face 722 of the SiC substrate 72, so that the step for removing the carbon layer on the silicide layer does not need to be carried out. Consequently, an increase in the number of steps can be prevented.

Further, the heat treatment of the SiC substrate 72 is carried out in a temperature condition of 1400° C. or higher, so that Si atoms in SiC can be sublimated efficiently from the rear face 722 side (carbon face side) of the SiC substrate 72. Further, the injected p-type impurity can be activated (the formation of the JTE structure 81) in parallel with the formation of the high carbon concentration SiC layer 73 during the heat treatment step at 1400° C. or higher. Since the heat treatment step and the activation step can be integrated into one step, the number of steps can be reduced. Furthermore, the impurity region (for example, the JTE structure 81) after the activation can be prevented from being subjected to high temperatures. Consequently, breakdown characteristics of the Schottky barrier diode 71 can be stabilized.

As above, the embodiments of the present invention have been described. However, the present invention can also be carried out by other forms.

For example, a portion of the high carbon concentration SiC layer 3, 53, 73 formed below an active region having the unit cell or the Schottky junction is showed in FIGS. 1, 3 and 4, respectively. However, the high carbon concentration SiC layer 3, 53, 73 may be formed below a peripheral region surrounding the active region.

Figure 5:
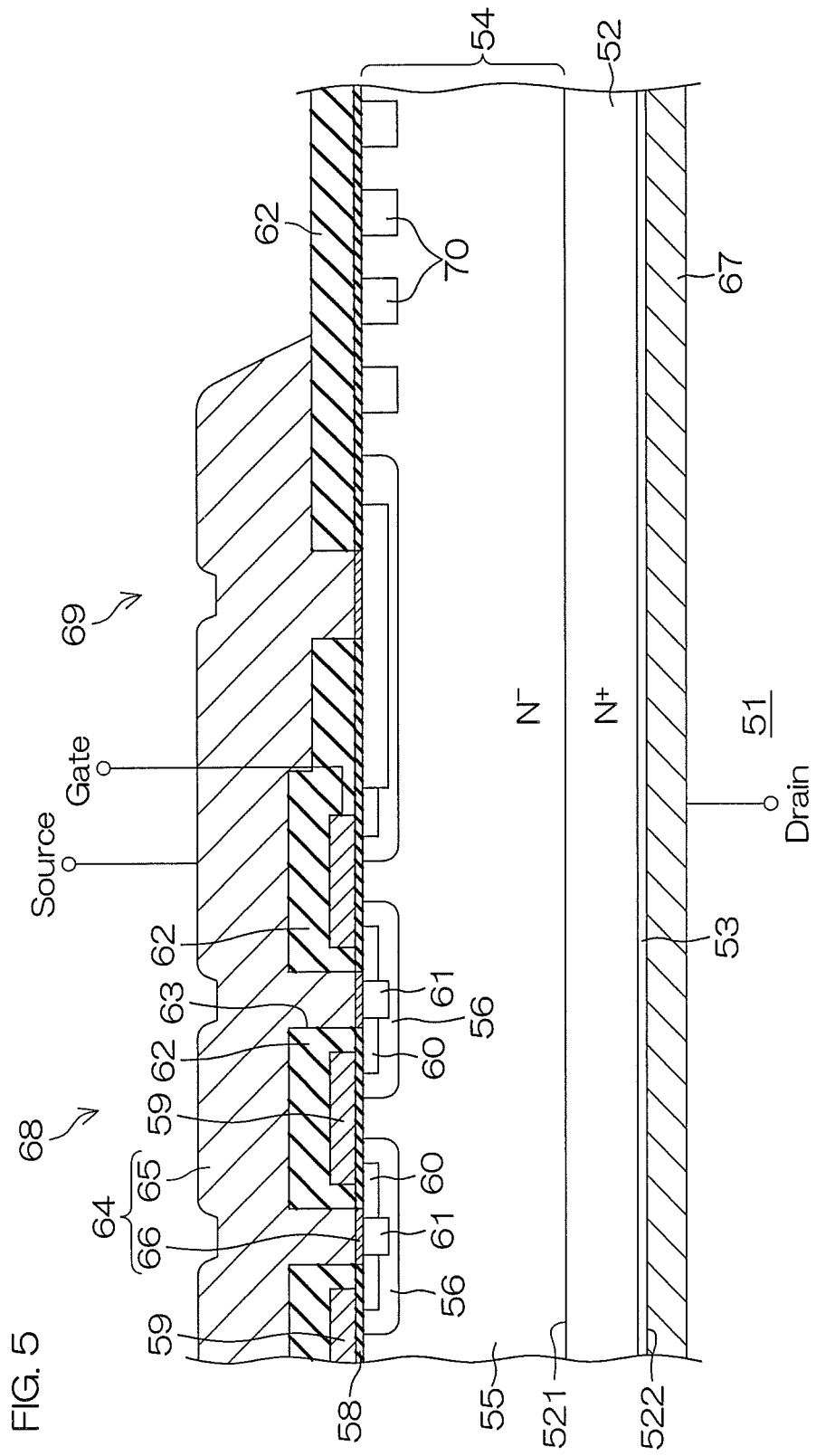
FIG. 5 is a schematic cross-sectional view of a semiconductor device according to a modification of the second embodiment's semiconductor device.
Figure 6:
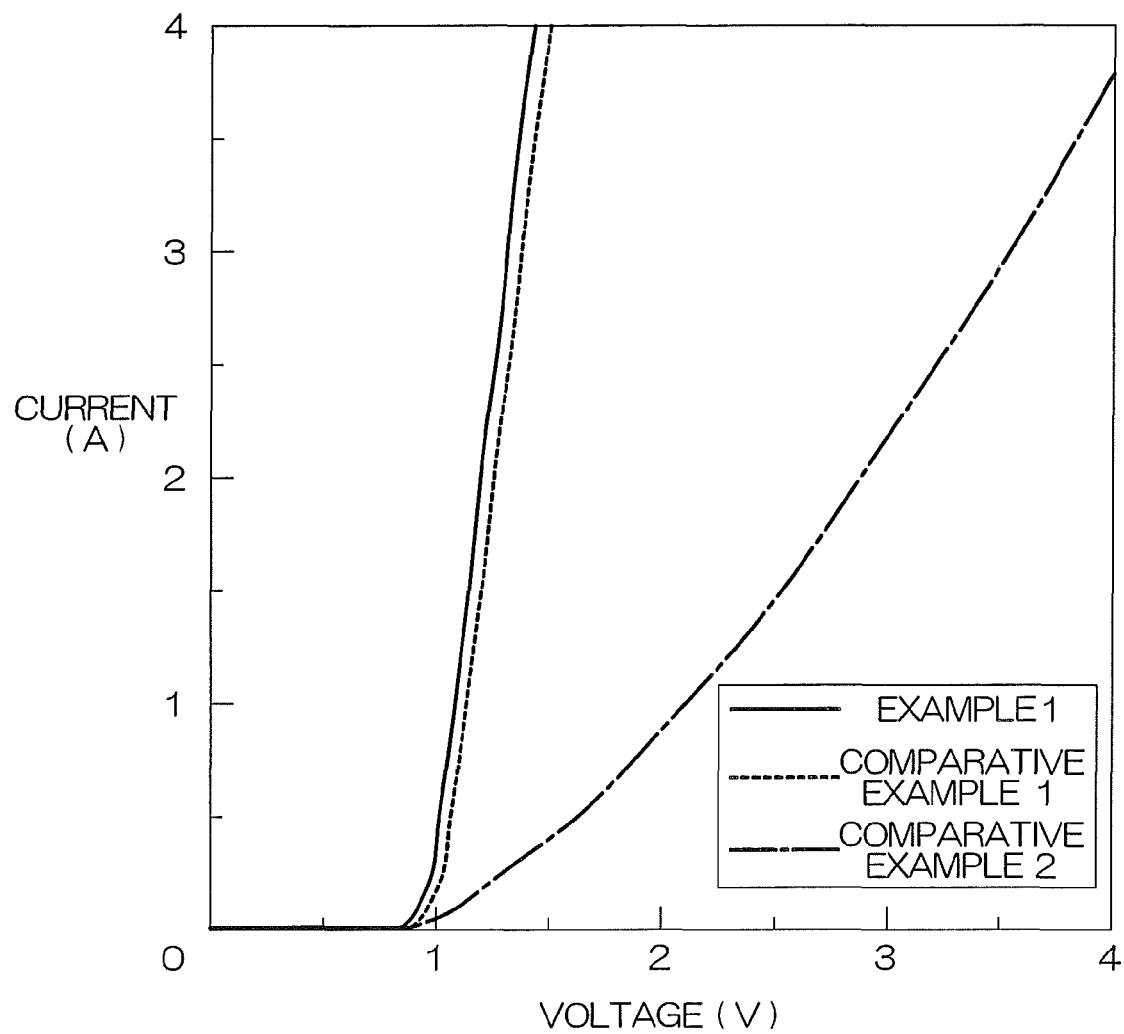
FIG. 6 is a diagram showing I-V characteristic curves of Schottky barrier diodes according to an example and comparative examples.

For example, in FIG. 5 showing a modification of the semiconductor device 51, an active region 68 having the unit cell including the body region 56, the gate electrode 59, etc. and a peripheral region 69 surrounding the active region 68 are formed on the SiC substrate 52. A p-type guard ring 70 is formed on the peripheral region 69 while spaced apart from the active region 68. In FIG. 5, the high carbon concentration SiC layer 53 is formed below the peripheral region 69 in the SiC substrate 52. Further, in the semiconductor device 1 and the Schottky barrier diode 71, the high carbon concentration SiC layer 3, 73 is formed below a peripheral region (not shown) surrounding an active region (not shown) in the same manner as the semiconductor device 51 in FIG. 5, respectively.

Further, a configuration of reversing the conductivity type of each semiconductor portion of the semiconductor device 1, the semiconductor device 51 and the Schottky barrier diode 71 may be employed. More specifically, a p-type portion may be an n-type one and an n-type portion may be a p-type one in the semiconductor device 1, the semiconductor device 51 and the Schottky barrier diode 71.

Further, a configuration of reversing the crystal faces of the front face 21, 521, 721 and the rear face 22, 522, 722 of the SiC substrate 2, 52, 72 may be employed. More specifically, the front face 21, 521, 721 may be a C face and the rear face 22, 522, 722 may be a Si face in the SiC substrate 2, 52, 72. That is, a form of mounting the device on the C face of the SiC substrate 2, 52, 72 may be employed.

Further, the step as shown in FIG. 2E (an inert gas+heat treatment at 1400° C. or higher) may be omitted if the heat treatment is carried out at 1400° C. or lower while an oxidizing gas is introduced into the heating furnace 27 in the step as shown in FIG. 2F.

Further, the metal layer in the present invention is represented by the forms of the drain electrode 17 of the trench gate VDMOSFET, the drain electrode 67 of the planar gate VDMOSFET and the cathode electrode 85 of the Schottky barrier diode 71 in the afore-described embodiments. However, the metal layer can be applied to a form of wiring contacted to an impurity region in other MISFETs, thyristors, bipolar transistors and insulated gate bipolar transistors (IGBT).

EXAMPLE

Next, the present invention is described based on an example and comparative examples. However, the present invention should not be restricted by the following example.

Example 1

First, a wafer-shaped SiC substrate (made by Cree, Inc.) was carried into a high temperature furnace and treated with heat at 1700° C. for 3 minutes while an inert gas was introduced. The SiC substrate was taken out after the heat treatment. Next, the SiC substrate was thermally oxidized to form an oxide film on the SiC substrate, and the oxide film was delaminated. Next, molybdenum (Mo) was deposited on a front face (a Si face) of the SiC substrate by sputtering, thereby forming a front metal layer. Next, titanium (Ti), nickel (Ni) and silver (Ag) were deposited in this order on a rear face (a C face) of the SiC substrate by sputtering, thereby forming a rear metal layer of a Ti/Ni/Ag laminated structure. Next, the SiC substrate was divided into pieces, each of which was 1280 μm square. As a result, a Schottky barrier diode configured so that the front metal layer and the SiC substrate were Schottky functioned was obtained.

Comparative Example 1

First, nickel (Ni) was deposited on a rear face (a C face) of a wafer-shaped SiC substrate (made by Cree, Inc.) by sputtering. Next, the SiC substrate was treated with heat at 1000° C. for 2 minutes by an RTA (Rapid Thermal Annealing) method, thereby siliciding nickel to form a nickel silicide layer. Next, a carbon layer having been formed along with the silicidation was delaminated. Next, molybdenum (Mo) was deposited on a front face (a Si face) of the SiC substrate by sputtering, thereby forming a front metal layer. Next, a rear metal layer of a Ti/Ni/Ag laminated structure was formed on the front face of the nickel silicide layer in the same manner as example 1. Next, the SiC substrate was divided into pieces, each of which is 1280 μm square. As a result, a Schottky barrier diode configured so that the front metal layer and the SiC substrate were Schottky functioned was obtained.

Comparative Example 2

First, molybdenum (Mo) was deposited on a front face (a Si face) of a wafer-shaped SiC substrate (made by Cree, Inc.) by sputtering, thereby forming a front metal layer. Next, a rear metal layer of a Ti/Ni/Ag laminated structure was formed on a rear face (a C face) of the SiC substrate in the same manner as example 1. Next, the SiC substrate was divided into pieces, each of which is 1280 μm square. As a result, a Schottky barrier diode configured so that the front metal layer and the SiC substrate were Schottky junctioned was obtained.
<Evaluation Test>
(1) I-V Characteristics of Schottky Barrier Diodes I-V characteristics at a time when a bias voltage was applied between the front metal layer and the rear metal layer were measured by using a parameter analyzer in the Schottky barrier diodes according to example 1 and comparative examples 1 and 2. Their results are shown in FIG. 5.

Comparing an I-V characteristic curve of example 1 with an I-V characteristic curve of comparative example 1 in FIG. 5, the Schottky barrier diode of example 1 is capable of flowing almost the same current as the Schottky barrier diode of comparative example 1 in a state where a bias voltage exceeding a threshold voltage is applied. By this, it has been recognized that the bonding of the rear metal layer and the SiC substrate in example 1 is an ohmic contact having a contact resistance as low as comparative example 1.

On the other hand, it has been recognized that a current value of the Schottky barrier diode of comparative example 2 is remarkably low as compared with example 1 and comparative example 1 even in a state where a bias voltage exceeding a threshold voltage is applied.
(2) XPS Waveforms and Composition Ratios of C to Si A composition of Si and C in the SiC substrate before the front metal layer was formed was measured by XPS (X-ray Photoelectron Spectroscopy) in example 1 and comparative examples 1 and 2.

Figure 7:
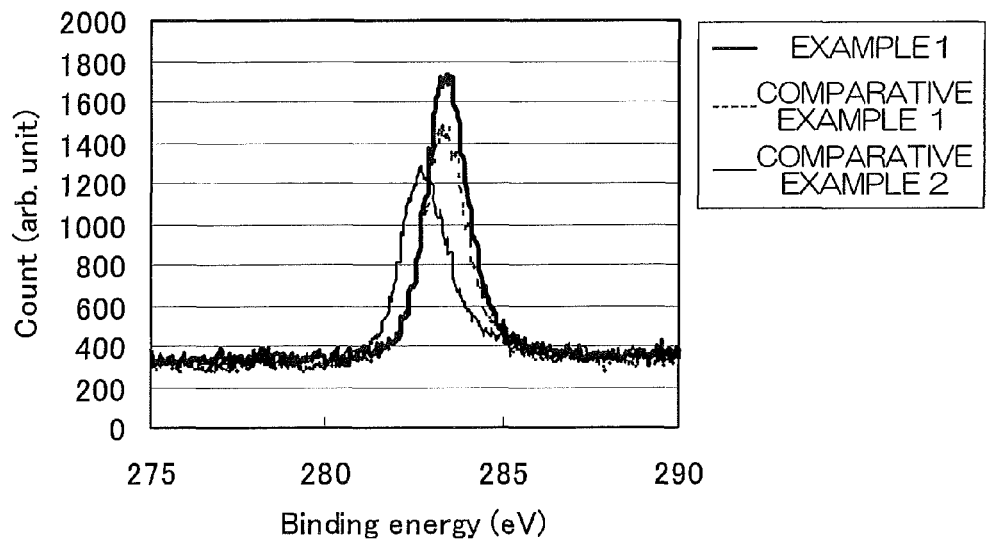
FIG. 7 is a diagram showing intensity distribution of binding energies of C1s when a SiC substrate before a front metal is formed is measured by XPS in example 1 and comparative examples 1 and 2, respectively.
Figure 8:
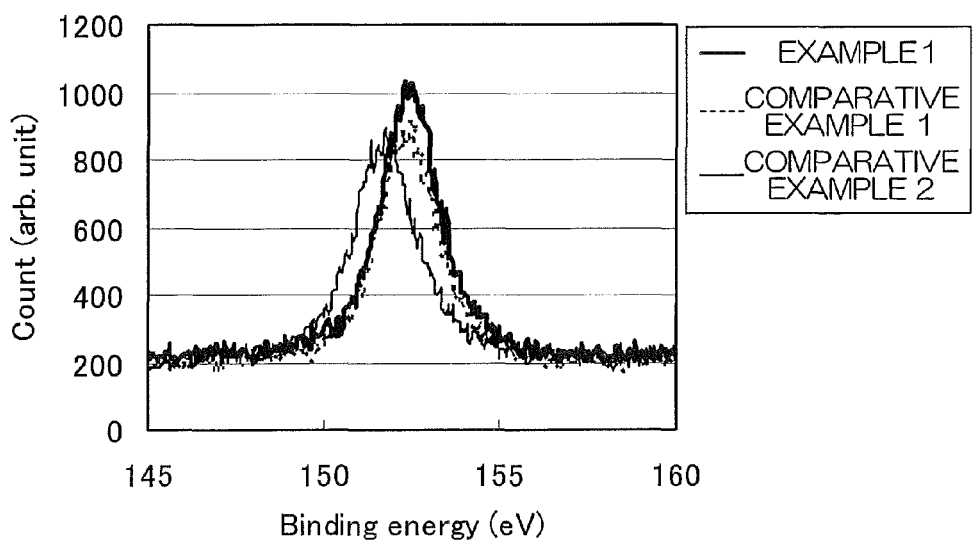
FIG. 8 is a diagram showing intensity distribution of binding energies of Si2s when the SiC substrate before the front metal is formed is measured by XPS in example 1 and comparative examples 1 and 2, respectively.
Figure 9:
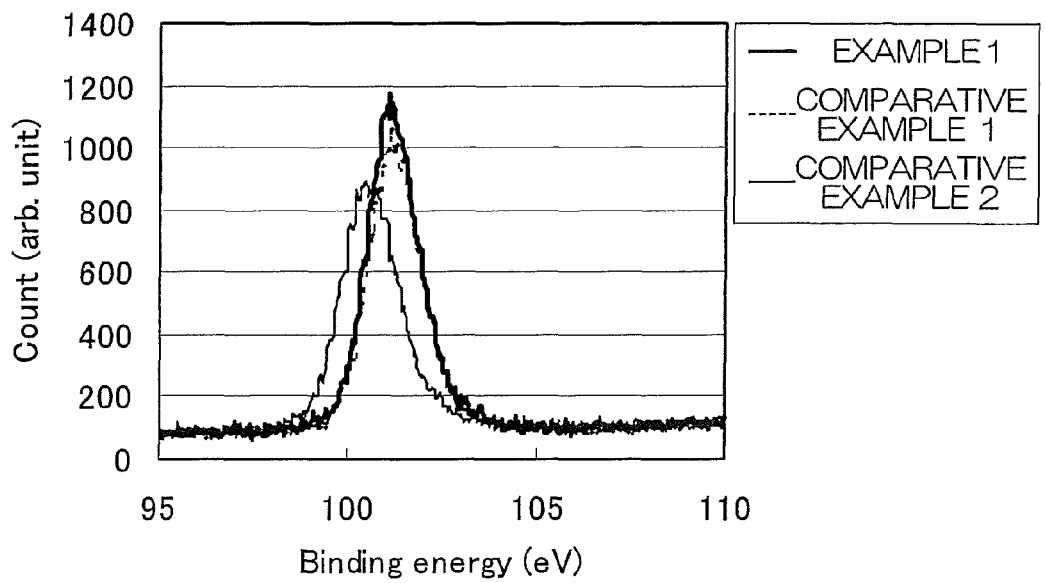
FIG. 9 is a diagram showing intensity distribution of binding energies of Si2p when the SiC substrate before the front metal is formed is measured by XPS in example 1 and comparative examples 1 and 2, respectively.
Figure 10:
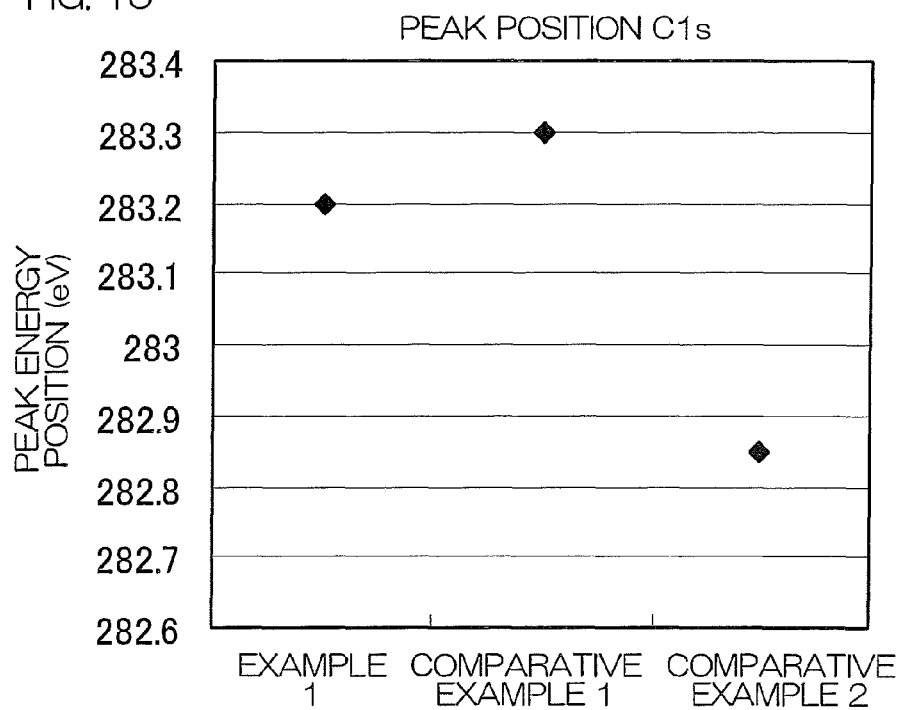
FIG. 10 is a diagram showing peak positions of the binding energies of C1s in example 1 and comparative examples 1 and 2, respectively.
Figure 11:
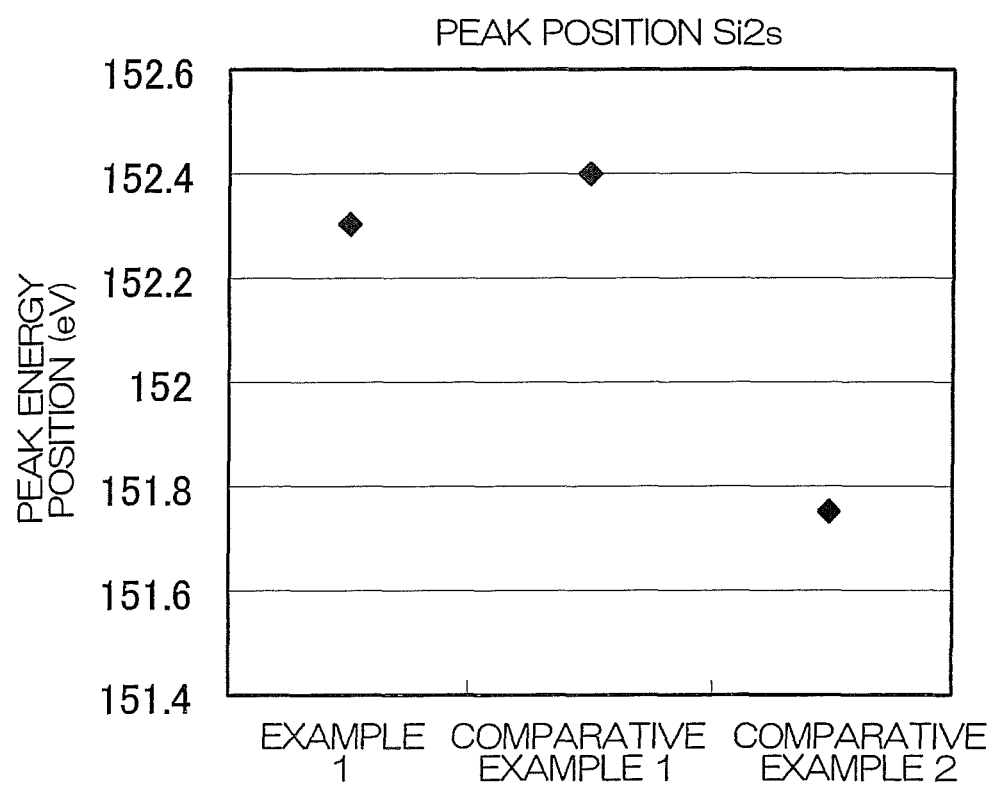
FIG. 11 is a diagram showing peak positions of the binding energies of Si2s in example 1 and comparative examples 1 and 2, respectively.
Figure 12:
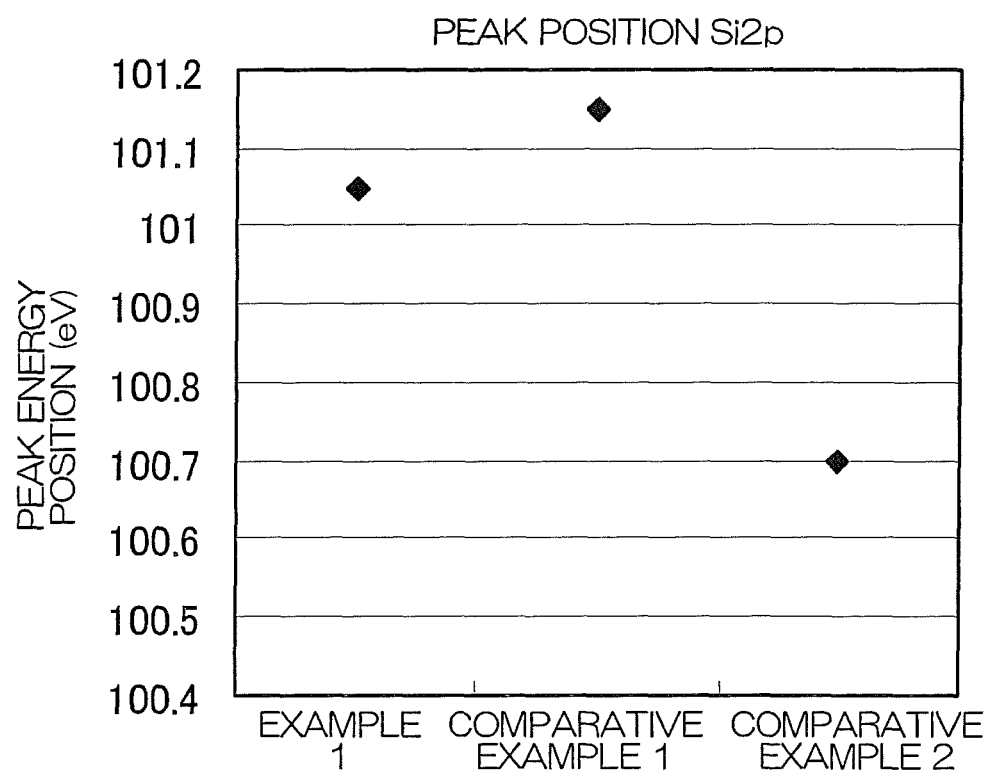
FIG. 12 is a diagram showing peak positions of the binding energies of Si2p in example 1 and comparative examples 1 and 2, respectively.
Figure 13:
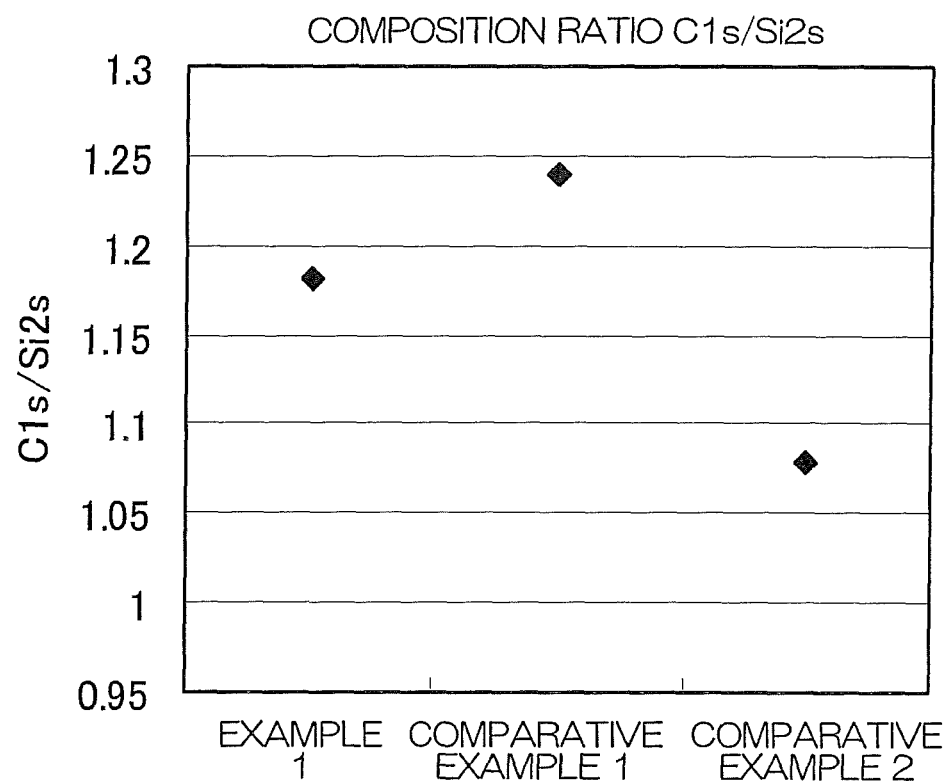
FIG. 13 is a diagram showing composition ratios of C1s to Si2s in example 1 and comparative examples 1 and 2, respectively.
Figure 14:
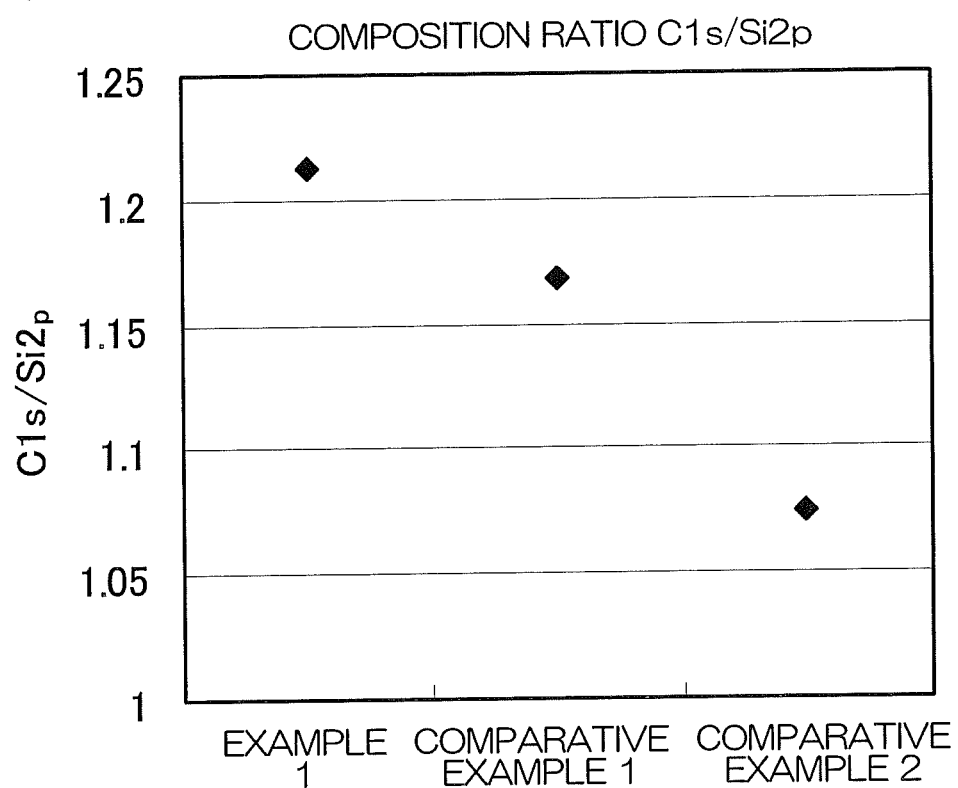
FIG. 14 is a diagram showing composition ratios of C1s to Si2p in example 1 and comparative examples 1 and 2, respectively.

Intensity distributions of binding energies in C1s, Si2s and Si2p respectively are shown in FIGS. 7 to 9. Further, peak positions of binding energies in C1s, Si2s and Si2p respectively are shown in FIGS. 10 to 12. Further, the composition ratios C1s/Si2s and C1s/Si2p are shown in FIG. 13 and FIG. 14. It is noted that x-axis corresponds to a binding energy and y-axis corresponds to a spectral intensity (arb. unit (arbitrary unit)) in FIGS. 7 to 9.

Comparing intensity distributions and peak positions of binding energies of C1s, Si2s and Si2p in example 1 and comparative examples 1 and 2 respectively in FIGS. 7 to 12, it has been recognized that a peak position of example 1 shifts to a high energy side with respect to a peak position of comparative example 2 which is a peak of a binding energy specific to SiC, and is almost the same as comparative example 1. Further, it has been recognized that a spectral intensity of example 1 in the peak position is larger than that of comparative example 1.

Further, it has been recognized that, in example 1, a high carbon concentration SiC layer having an excellent composition ratio of C to Si can be formed as shown in FIG. 13 and FIG. 14 without performing steps as in comparative example 1 large in the number of steps such as RTA treatment, silicidation and delamination of a carbon layer, but by performing a simple step of heat treatment at 1700° C. in an inert gas atmosphere.

(3) Presence of Layer Delamination

An electron beam was scanned over the rear metal layers of the Schottky barrier diodes according to example 1 and comparative example 1 and 2 by using a scanning electron microscope (SEM). Information detected by the electron beam scanning was subjected to image processing and SEM images were obtained.

When the presence of layer delamination in each rear metal layer was examined by visually checking the SEM images, layer delamination could not be recognized in example 1.

On the other hand, layer delamination between the nickel silicide layer and the rear metal layer was clearly recognized in comparative example 1. Further, layer delamination between the SiC substrate and the rear metal layer was clearly recognized in comparative example 2.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-170239 filed with the Japan Patent Office on Jul. 21, 2009 and Japanese Patent Application No. 2010-152084 filed with the Japan Patent Office on Jul. 2, 2010, the disclosures of which are incorporated herein by reference.

What is claimed is:

1. A semiconductor device comprising:
    a semiconductor layer composed of SiC; and
    a metal layer formed on the semiconductor layer; wherein
    the semiconductor layer has a semiconductor substrate having a first impurity concentration and an epitaxial layer formed on the semiconductor substrate and having a second impurity concentration;
    the metal layer is formed on a side of the semiconductor substrate of the semiconductor layer;
    the first impurity concentration is higher than the second impurity concentration;
    the semiconductor substrate includes a high carbon concentration layer containing more highly concentrated carbon than a part of the semiconductor substrate other than the high carbon concentration layer; and
    the metal layer is in contact with the high carbon concentration layer.

2. The semiconductor device according to claim 1, wherein the high carbon concentration layer includes a high energy layer having a higher binding energy than a binding energy specific to SiC.

3. The semiconductor device according to claim 1, wherein the first impurity concentration of the semiconductor substrate is $1\times10^{17}$ cm$^{-3}$ or more.

4. The semiconductor device according to claim 3, wherein the first impurity concentration of the semiconductor substrate is $1\times10^{18}$ to $1\times10^{21}$ cm$^{-3}$.

5. The semiconductor device according to claim 1, wherein the metal layer has a Ti/Ni/Ag laminated structure in which Ti, Ni and Ag are laminated in this order from the high carbon concentration layer.

6. The semiconductor device according to claim 5, wherein the metal layer has a Ti/Ni/Ag/Au laminated structure in which Au is further laminated on the Ti/Ni/Ag laminated structure.

7. The semiconductor device according to claim 1, wherein the semiconductor layer has a vertical transistor structure containing a drain formed at the one side and a gate and a source formed at the other side on the opposite side of the drain, and the metal layer is a drain electrode bonded to the drain.

8. The semiconductor device according to claim 1, wherein a thickness of the high carbon concentration layer is on the order of $2.5\times10^{-4}$ to $1\times10^{-2}$% of that of the semiconductor substrate.

9. The semiconductor device according to claim 8, wherein the thickness of the semiconductor substrate is 100 μm to 400 μm.

10. The semiconductor device according to claim 1, wherein a thickness of the high carbon concentration layer is 1 nm to 10 nm.

11. The semiconductor device according to claim 1, further comprising an ohmic metal ohmically contacted to the epitaxial layer.

12. The semiconductor device according to claim 11, wherein the ohmic metal is composed of Ni.

13. The semiconductor device according to claim 11, further comprising a source metal formed on the ohmic metal and composed of a metal material containing Al as a main ingredient.

14. The semiconductor device according to claim 1, wherein a composition ratio of C to Si (C/Si) in the high carbon concentration layer is such that a composition ratio of C1s to Si (Si2p) in 2p orbital (C1s/Si2p) is 1.2 to 1.4.

15. The semiconductor device according to claim 1, wherein a composition ratio of C to Si (C/Si) in the high carbon concentration layer is such that a composition ratio of C (C1s) in 1s orbital to Si (Si2s) in 2s orbital (C1s/Si2s) is 1.1 to 1.2.

* * * * *